United States Patent
Noh

(10) Patent No.: US 12,035,526 B2
(45) Date of Patent: Jul. 9, 2024

(54) VERTICAL SEMICONDUCTOR DEVICE AND METHOD FOR FABRICATING THE SAME

(71) Applicant: SK hynix Inc., Icheon-si (KR)

(72) Inventor: Yoo Hyun Noh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 322 days.

(21) Appl. No.: 17/184,143

(22) Filed: Feb. 24, 2021

(65) Prior Publication Data

US 2022/0059561 A1    Feb. 24, 2022

(30) Foreign Application Priority Data

Aug. 21, 2020    (KR) .................... 10-2020-0105335

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 43/10* | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 43/40; H10B 43/50; H01L 23/5283
See application file for complete search history.

(56) References Cited

U.S. PATENT DOCUMENTS

| | | | |
|---|---|---|---|
| 10,510,770 B2 | 12/2019 | Harada et al. | |
| 2020/0043830 A1* | 2/2020 | Baek | H10B 41/27 |
| 2021/0305271 A1* | 9/2021 | Kim | H10B 43/40 |

* cited by examiner

*Primary Examiner* — Jay C Kim
*Assistant Examiner* — Woo K Lee
(74) *Attorney, Agent, or Firm* — William Park & Associates Ltd.

(57) ABSTRACT

A method for fabricating a semiconductor device includes forming a source structure over a lower structure with interconnections; forming a first contact plug that penetrates the source structure to be coupled to the interconnections, and a first sacrificial pad that penetrates the source structure and is spaced apart from the first contact plug; forming an upper structure that covers the first sacrificial pad, the first contact plug, and the source structure; forming a second contact plug that penetrates the upper structure and contacts the first contact plug, forming a second sacrificial pad that penetrates the upper structure to contact the first sacrificial pad and is spaced apart from the second contact plug; and replacing the first sacrificial pad and the second sacrificial pad with a dielectric supporter.

20 Claims, 26 Drawing Sheets

VERTICAL SEMICONDUCTOR DEVICE AND METHOD FOR FABRICATING THE SAME

CROSS-REFERENCE TO RELATED APPLICATIONS

The present application claims priority of Korean Patent Application No. 10-2020-0105335, filed on Aug. 21, 2020, which is incorporated herein by reference in its entirety.

BACKGROUND

1. Field

Exemplary embodiments of the present invention relate to a semiconductor device, and more particularly, to a vertical semiconductor device.

2. Description of the Related Art

A semiconductor device, such as a three-dimensional (3D) NAND, includes a plurality of memory cells that are arranged in a height direction of a channel, as a pillar-type channel, extending in the height direction, covered with a memory layer.

SUMMARY

In accordance with an embodiment of the present invention, a method for fabricating a semiconductor device includes: forming a source structure over a lower structure with interconnections; forming a first contact plug that penetrates the source structure to be coupled to the interconnections, and a first sacrificial pad that penetrates the source structure and is spaced apart from the first contact plug; forming an upper structure that covers the first sacrificial pad, the first contact plug, and the source structure; forming a second contact plug that penetrates the upper structure and contacts the first contact plug, forming a second sacrificial pad that penetrates the upper structure to contact the first sacrificial pad and is spaced apart from the second contact plug; and replacing the first sacrificial pad and the second sacrificial pad with a dielectric supporter.

In accordance with another embodiment of the present invention, a method for fabricating a semiconductor device includes: forming a source structure over a lower structure including interconnections; forming a first contact plug that penetrates the source structure to be coupled to the interconnections, forming a first line-type sacrificial pad that penetrates the source structure and is spaced apart from the first contact plug; forming an alternating stack of dielectric layers and sacrificial layers over the first line-type sacrificial pad, the first contact plug, and the source structure; forming a second contact plug that penetrates the alternating stack and contacts the first contact plug, forming a second line-type sacrificial pad that is spaced apart from the second contact plug to penetrate the alternating stack and contact the first line-type sacrificial pad; replacing the first line-type sacrificial pad and the second line-type sacrificial pad with a line-type supporter; forming a plurality of channel structures that penetrate the alternating stack and the sacrificial source layer, the plurality of channel structures formed to be spaced apart from the line-type supporter; and replacing the sacrificial layers of the alternating stack with gate electrodes.

In accordance with yet another embodiment of the present invention, a method for fabricating a semiconductor device includes: forming a source structure over a lower structure with interconnections; forming an alternating stack of a plurality of dielectric layers and a plurality of sacrificial layers over the source structure; forming a line-type supporter that divides the alternating stack into a first alternating stack and a second alternating stack; and replacing the sacrificial layers of the first alternating stack with gate electrodes, wherein, while the sacrificial layers of the first alternating stack are being replaced with the gate electrodes, the sacrificial layers of the second alternating stack are not replaced.

In accordance with still another embodiment of the present invention, a semiconductor device includes: a lower structure with interconnections; a source structure with a first source stack and a second source stack that are spaced apart from each other, the source structure positioned over the lower structure; a first alternating stack with a plurality of gate electrodes, the first alternating stack positioned over the first source stack; a second alternating stack with a plurality of gate-level dielectric layers at the same level as the gate electrodes, the second alternating stack positioned over the second source stack; a line-type supporter between the first alternating stack and the second alternating stack; and a contact structure penetrating the second alternating stack and the second source stack to be coupled to the interconnections.

DETAILED DESCRIPTION

Figure 1A:
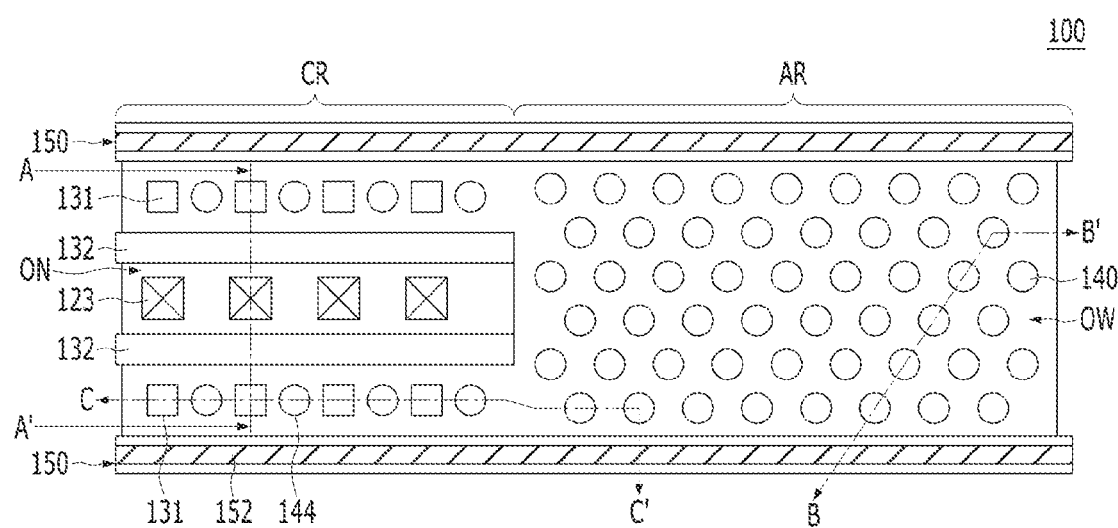
FIG. 1A is a layout, illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present invention are directed to a vertical semiconductor device with improving reliability and a method for fabricating the same.

Figure 1B:
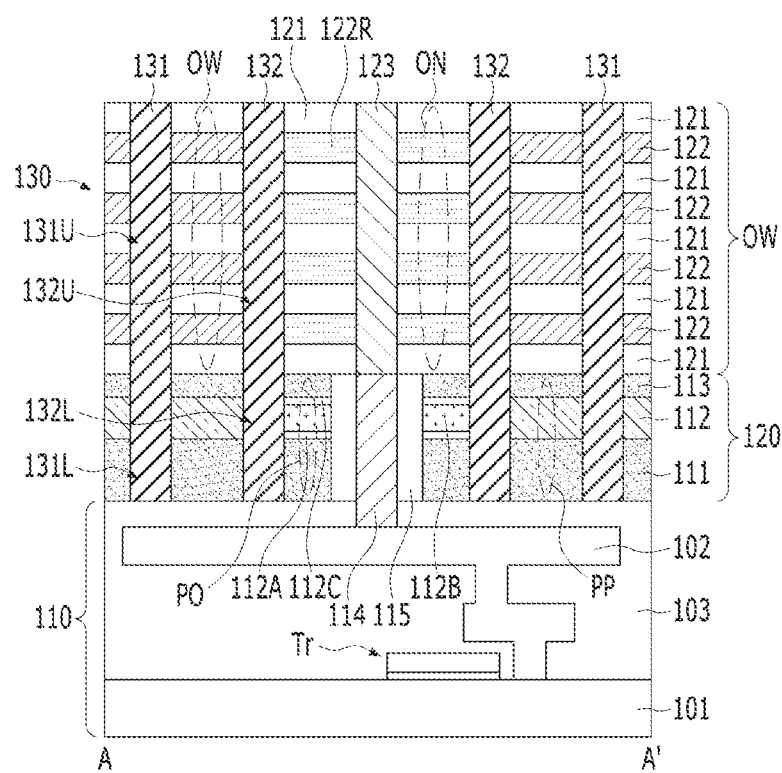
FIG. 1B is a cross-sectional view that is taken along a line A-A" of FIG. 1A.
Figure 1C:
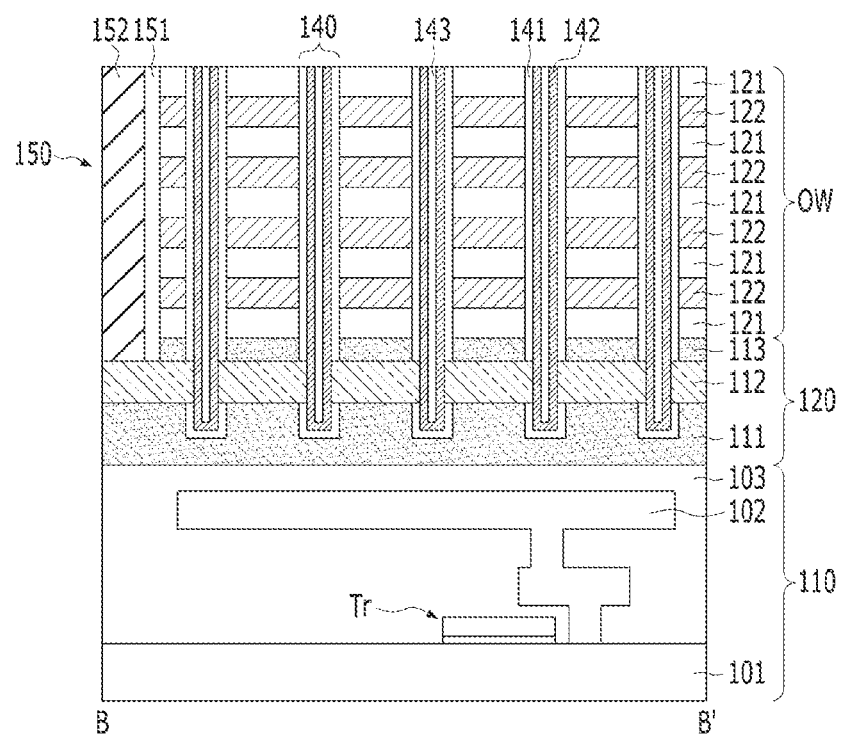
FIG. 1C is a cross-sectional view that is taken along a line B-B' of FIG. 1A.
Figure 1D:
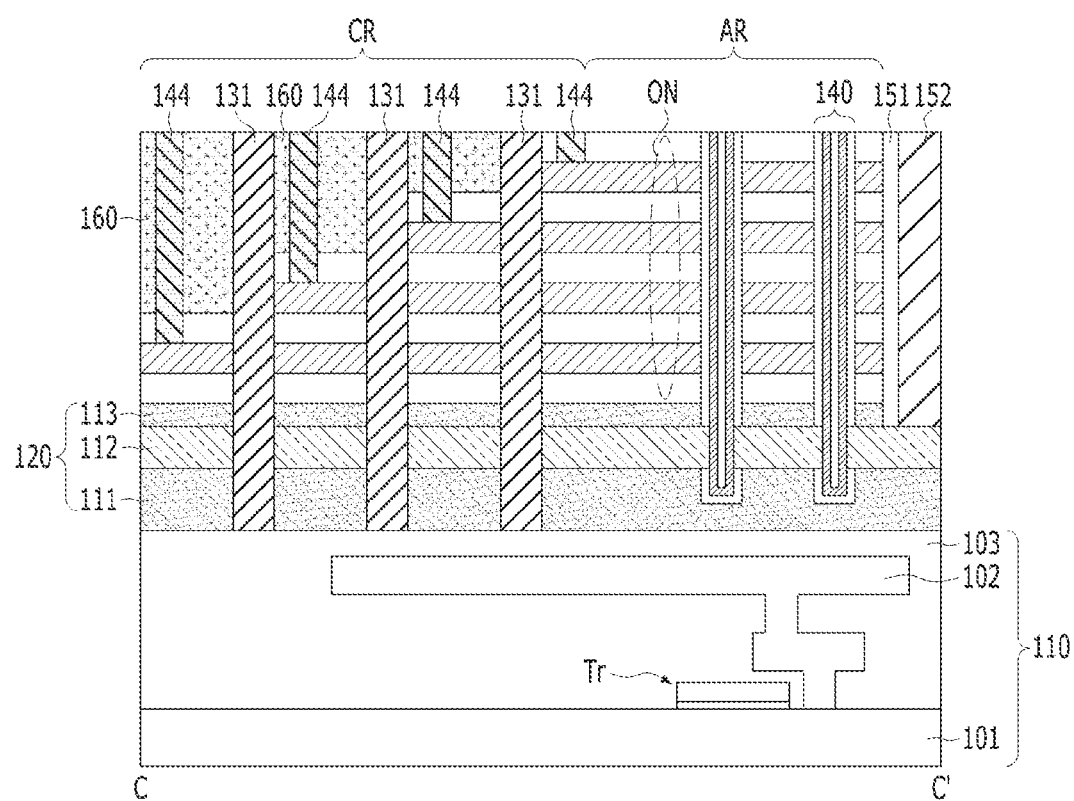
FIG. 1D is a cross-sectional view that is taken along a line C-C' of FIG. 1A.

FIG. 1A is a layout, illustrating a semiconductor device 100 in accordance with an embodiment of the present invention. FIG. 1B is a cross-sectional that is view taken along a line A-A' of FIG. 1A. FIG. 1C is a cross-sectional view that is taken along a line B-B' of FIG. 1A. FIG. 1D is a cross-sectional view that is taken along a line C-C' of FIG. 1A.

Referring to FIGS. 1A to 1D, the semiconductor device 100 may include a lower structure 110 that is disposed over a semiconductor substrate 101. The lower structure 110 may include a transistor Tr and interconnections 102. The transistor Tr may include, for example, an NMOSFET, a PMOSFET, or a CMOSFET. The transistor Tr and the interconnections 102 may be covered with an inter-layer dielectric layer 103. The lower structure 110 may function as a circuit for operating a memory cell that is included in the memory device. The lower structure 110 may be referred to as a peripheral circuit portion.

A source structure 120 may be formed over the lower structure 110. The source structure 120 may include source conductive layers 111 and 113 and a source level contact layer 112 that is positioned between the source conductive layers 111 and 113. The source structure 120 may include a first source stack PP and a second source stack PO. The first source stack PP may include the source conductive layers 111 and 113 and the source level contact layer 112. The source conductive layers 111 and 113 and the source level contact layer 112 may include a semiconductor material. The source level contact layer 112 may be doped with a conductive impurity, such as phosphorus, arsenic, boron, or the like. For example, the source level contact layer 112 may include phosphorus-doped polysilicon. According to another embodiment of the present invention, the source level contact layer 112 may be doped with a non-conductive impurity, or a conductive impurity and a non-conductive impurity. For example, the source level contact layer 112 may include polysilicon doped with carbon. According to another embodiment of the present invention, the source-level contact layer 112 may include two layers of phosphorus-doped polysilicon and carbon-doped polysilicon. The source conductive layers 111 and 113 and the source level contact layer 112 may include polysilicon. A second source stack PO may include the source conductive layers 111 and 113, and the second source stack PO may further include liner layers 112A and 112C and a sacrificial source layer 112B that are positioned between the source conductive layers 111 and 113. The liner layers 112A and 112C may include a dielectric material, and the sacrificial source layer 112B may include a semiconductor material. For example, the liner layers 112A and 112C may include a silicon oxide-based material, and the sacrificial source layer 112B may include polysilicon. At least one liner layer, among the liner layers 112A and 112C, may include $SiO_2$, SiCO, or a combination thereof.

A first contact plug 114 may be formed to penetrate the source structure 120, and a spacer 115 may be formed on a sidewall of the first contact plug 114. The first contact plug 114 may penetrate the second source stack PO. The first contact plug 114 may be coupled to at least one of the interconnections 102 of the lower structure 110.

An upper structure 130 may be formed over the source structure 120. The upper structure 130 may include a first alternating stack OW and a second alternating stack ON. The first alternating stack OW may include dielectric layers 121 and gate electrodes 122 that are alternately stacked in a vertical direction. The second alternating stack ON may include the dielectric layers 121 and the gate-level dielectric layers 122R that are alternately stacked in the vertical direction. The second alternating stack ON may be positioned between the neighboring first alternating stacks OW. The height of the first alternating stack OW and the height of the second alternating stack ON may be the same. The first alternating stack OW may be positioned in a cell array region AR, and the second alternating stack ON may be positioned in a contact region CR. The contact region CR may include an area in which pad portions of the gate electrodes 122 are formed. The contact region CR may further include an area in which the first contact plugs 114 that are coupled to the interconnections 102 are formed.

A plurality of supporters 131 and 132 that penetrate the upper structure 130 may be formed. The supporters 131 and 132 may extend to a portion of the source structure 120. For example, the supporters 131 and 132 may penetrate the source conductive layers 111 and 113 and the source level contact layer 112. The supporters 131 and 132 may include pillar-type supporters 131 and line-type supporters 132. The pillar-type supporters 131 may support the first alternating stack OW, and the line-type supporters 132 may support the second alternating stack ON. The pillar-type supporters 131 may penetrate the first alternating stack OW. The line-type supporters 132 may be positioned between the first alternating stack OW and the second alternating stack ON.

Each of the pillar-type supporters 131 may include a lower pillar-type supporter 131L and an upper pillar-type supporter 131U. The line-type supporters 132 may include a lower line-type supporter 132L and an upper line-type supporter 132U. The lower pillar-type supporter 131L and the lower line-type supporter 132L may penetrate the source structure 120. The lower pillar-type supporter 131L may penetrate a first source stack PP of the source structure 120, and the upper pillar-type supporter 131U may penetrate the first alternating stack OW. The lower line-type supporter 132L may penetrate the source structure 120. The lower pillar-type supporter 131L may have a width that is greater than the width of the upper pillar-type supporter 131U. The lower line-type supporter 132L may have a width that is greater than the width of the upper line-type supporter 132U. The upper line-type supporter 132U may be positioned between the first alternating stack OW and the second alternating stack ON. The source structure 120 may surround a sidewall of the lower pillar-type supporter 131L and a sidewall of the lower line-type supporter 132L.

A second contact plug 123 that penetrates the second alternating stack ON may be formed. The second contact plug 123 may be formed over the first contact plug 114. The first contact plug 114 and the second contact plug 123 may be formed of the same material. The first contact plug 114 may have a width that is greater than the width of the second contact plug 123.

A plurality of channel structures 140 penetrating the first alternating stack OW of the upper structure 130 may be formed. The channel structure 140 may include a memory layer 141 and a channel layer 142. The memory layer 141 may include an ONO structure. The ONO structure may include a stack of an oxide, a nitride, and an oxide. The memory layer 141 may include a stack of a blocking layer, a charge trapping layer, and a tunnel dielectric layer. The blocking layer and the tunnel dielectric layer may include an oxide, and the charge trapping layer may include a nitride. The channel layer 142 may include a polysilicon layer. According to another embodiment of the present invention, the blocking layer may include a high-k material, and the high-k material may include aluminum oxide or hafnium oxide. The channel layer 142 may have a cylinder shape with an inner space. The memory layer 141 may surround the outer wall of the channel layer 142. The channel structure 140 may further include a core dielectric layer 143. The inner space of the channel layer 142 may be completely filled with the core dielectric layer 143. The core dielectric layer 143 may include silicon oxide or silicon nitride. Although not illustrated, a conductive pad that is coupled to the upper end of the channel layer 142 may be further formed after the core dielectric layer 143 is recessed. The gate electrodes 122 may surround the channel structure 140. The channel structure 140 may penetrate the dielectric layers 121 and the gate electrodes 122.

The lower sidewall of the channel structure 140 may be coupled to the source structure 120. For example, the channel layer 142 of the channel structure 140 may be directly coupled to the source level contact layer 112. The memory layer 141 may be cut so that the channel layer 142 may directly contact the source level contact layer 112.

The ends of the gate electrodes 122 may be gate pad portions, formed in a stepped structure, and gate contact plugs 144 may be coupled to the ends of the gate electrodes 122, respectively. An inter-layer dielectric layer 160 may cover the stepped structure, and the gate contact plugs 144 may penetrate the inter-layer dielectric layer 160 to be coupled to the ends of the gate electrodes 122. The pillar-type supporters 131 may penetrate the stepped structure of the ends of the gate electrodes 122.

The source level contact layer 112 may be coupled to the source contact plug 152. A sealing layer 151 may be formed between the source contact plug 152 and the second alternating stack OW. The sealing layer 151 and the source contact plug 152 may fill a vertical slit 150. The sealing layer 151 may be formed on the sidewall of the vertical slit 150, and the source contact plug 152 may be formed over the sealing layer 151.

As described above, bridges between the source level contact layer 112 and the first contact plug 114 may be prevented by the line-type supporters 132.

Figure 2A:
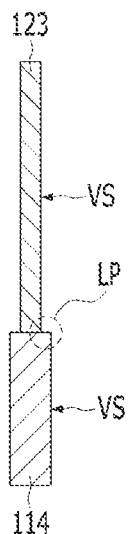
FIGS. 2A and 2B illustrate a semiconductor device in accordance with another embodiment of the present invention.
Figure 2B:
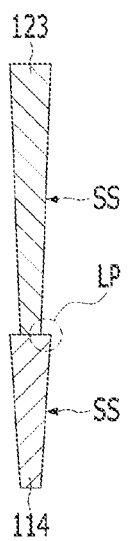

FIGS. 2A and 2B illustrate a semiconductor device in accordance with another embodiment of the present invention. FIGS. 2A and 2B show another embodiment of a stack structure of the first contact plug 114 and the second contact plug 123, shown in FIG. 1B. Referring back to FIG. 1B, the width of the first contact plug 114 and the width of the second contact plug 123 may be the same.

Referring to FIGS. 2A and 2B, the width of the first contact plug 114 may be greater than the width of the second contact plug 123. The upper surface of the first contact plug 114 may have a width that is greater than the width of the lower surface of the second contact plug 123. The lower surface of the second contact plug 123 may directly contact the upper surface of the first contact plug 114 (refer to the reference symbol 'LP').

Referring back to FIGS. 1B and 2A, the first contact plug 114 and the second contact plug 123 may have a vertical sidewall VS, individually.

Referring back to FIG. 2B, the first contact plug 114 and the second contact plug 123 may have a sloped sidewall SS, individually.

FIGS. 3 to 19 illustrate an example of a method for fabricating a semiconductor device in accordance with an embodiment of the present invention. In FIGS. 3 to 19, structures other than the semiconductor substrate 101, the interconnections 102, and the inter-layer dielectric layer 103 of the lower structure 110 are omitted. In FIGS. 3 to 19, the reference numerals also appearing in FIGS. 1A to 1D may denote the same constituent elements.

Figure 3:
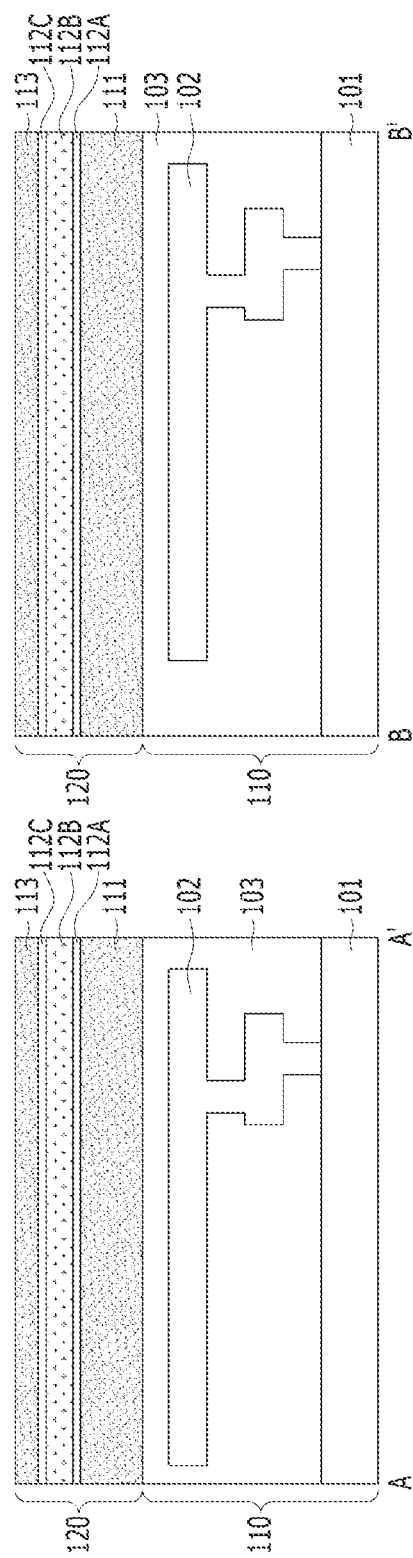
FIGS. 3 to 19 illustrate an example of a method for fabricating a semiconductor device in accordance with an embodiment of the present invention.

Referring to FIG. 3, a source structure 120 may be formed over the lower structure 110 with the semiconductor substrate 101, the interconnections 102, and inter-layer dielectric layer 103.

The semiconductor substrate 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a mufti-layer thereof. The semiconductor substrate 101 may also include other semiconductor materials, such as germanium. The semiconductor substrate 101 may include a III/V group semiconductor substrate, for example, a compound semiconductor substrate such as GaAs. The semiconductor substrate 101 may include a Silicon-On-Insulator (SOI) substrate. Although not illustrated, a transistor Tr with a gate electrode may be formed over the semiconductor substrate 101.

The source structure 120 may have a multi-layer structure in which a sacrificial source layer 112B is positioned between the source conductive layers 111 and 113. The source structure 120 may further include a plurality of liner layers 112A and 112C. The liner layers 112A and 112C may be positioned between the source conductive layers 111 and 113 and the sacrificial source layer 112B.

The source conductive layers 111 and 113 and the sacrificial source layer 112B may have an etch selectivity with respect to the liner layers 112A and 112C. The source conductive layers 111 and 113 and the sacrificial source layer 112B may include a semiconductor material, and the liner layers 112A and 112C may include a dielectric material. The source conductive layers 111 and 113 and the sacrificial source layer 112B may include polysilicon, and the liner layers 112A and 112C may include silicon oxide. The liner layers 112A and 112C may be thinner than the source conductive layers 111 and 113 and the sacrificial source layer 112B. The sacrificial source layer 112B may have the same thickness as or thinner than those of the source conductive layers 111 and 113.

The liner layers 112A and 112C may protect the source conductive layers 111 and 113 while the subsequent sacrificial source layer 112B is being removed.

The liner layers 112A and 112C may include a silicon oxide-based material. At least one liner layer among the liner layers 112A and 112C may include $SiO_2$, SiCO, or a combination thereof.

Figure 4:
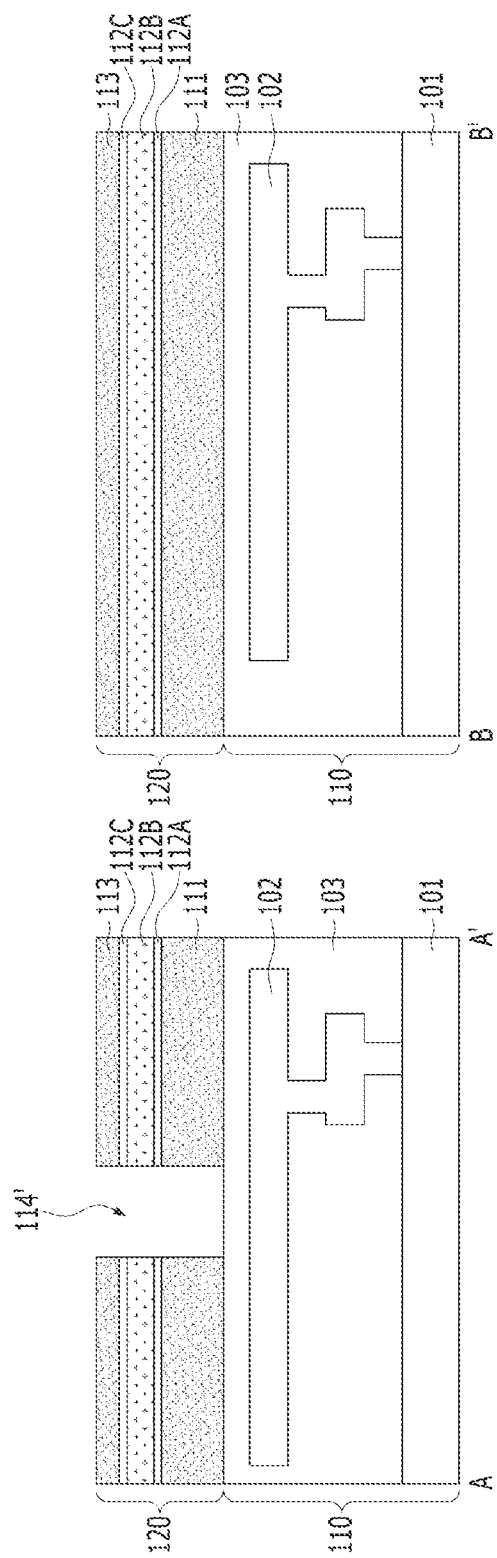

Referring to FIG. 4, a contact hole 114' may be formed in the source structure 120. The contact hole 114' may penetrate the source structure 120, and the bottom surface of the contact hole 114' may contact the inter-layer dielectric layer 103.

Figure 5:
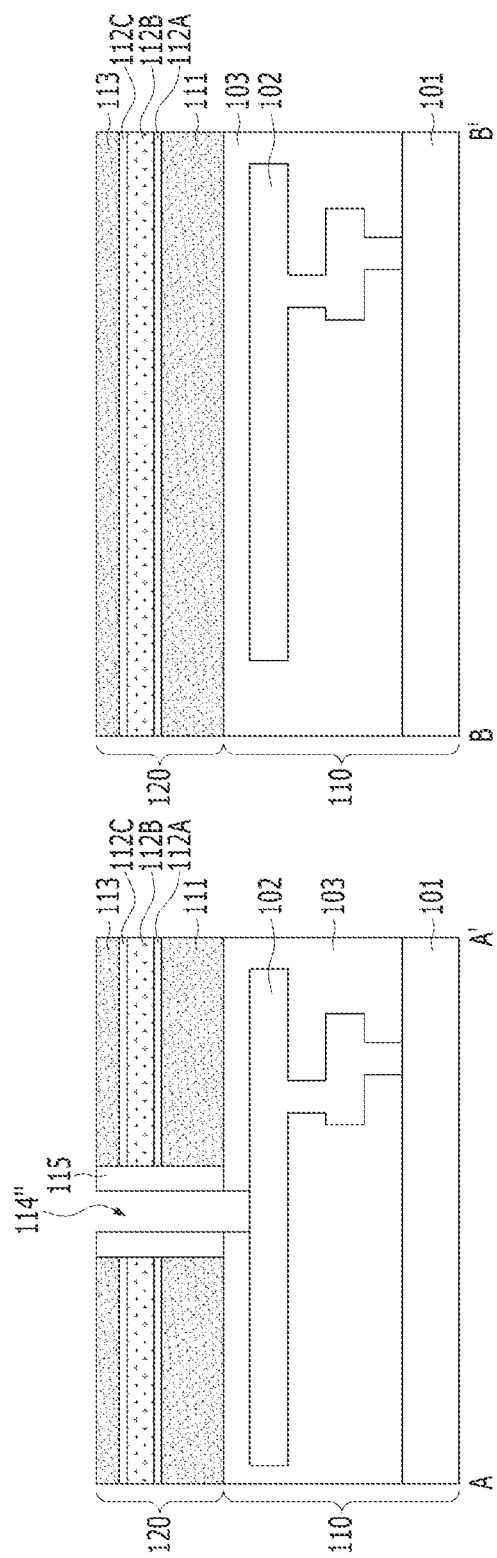

Referring to FIG. 5, a spacer 115 may be formed on a sidewall of the contact hole 114'. The spacer 115 may be formed by depositing and etching a dielectric material over the contact hole 114'. The spacer 115 may include silicon oxide, silicon nitride, or a combination thereof. A contact hole 114" with a smaller size may be defined by the spacers 115.

A portion of the inter-layer dielectric layer 103 may be etched so as to be self-aligned with the spacer 115. Accordingly, the bottom surface of the contact hole 114" may extend to the surface of the interconnections 102.

Figure 6:
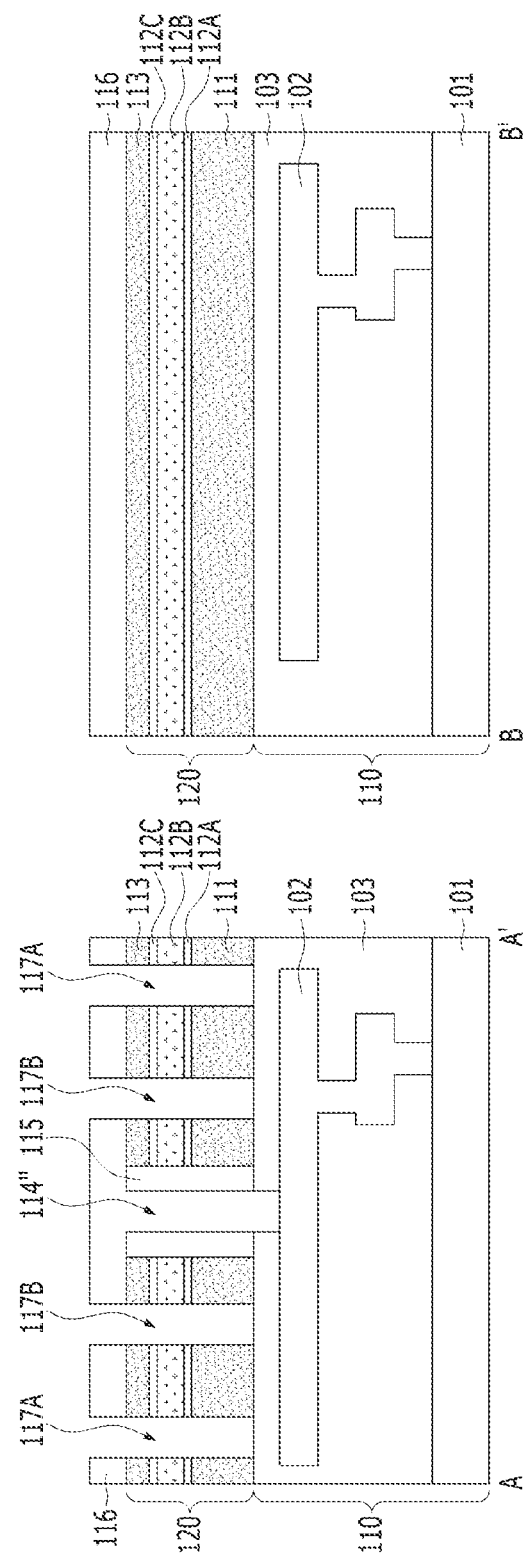

Referring to FIG. 6, a mask layer 116 may be formed over the contact hole 114" and the source structure 120. The mask layer 116 may have an etch selectivity with respect to the source structure 120. The mask layer 116 may include a photoresist, amorphous carbon, etc. A portion of the mask layer 116 may fill the contact hole 114". Accordingly, the contact hole 114" may be blocked due to the subsequent etching process.

The source structure 120 may be etched by using the mask layer 116. Accordingly, a plurality of openings 117A and 117B may be formed in the source structure 120. The openings 117A and 117B may include hole-type openings 117A and line-type openings 117B. The line-type openings 117B may be positioned on both sides of the contact hole 114". The contact hole 114" may be positioned between the line-type openings 117B. The hole-type openings 117A may be positioned to be spaced apart from the line-type openings 117B. The line-type openings 117B may be positioned between the contact holes 114" and the hole-type openings 117A. The openings 117A and 117B may be referred to as sacrificial openings.

Figure 7:
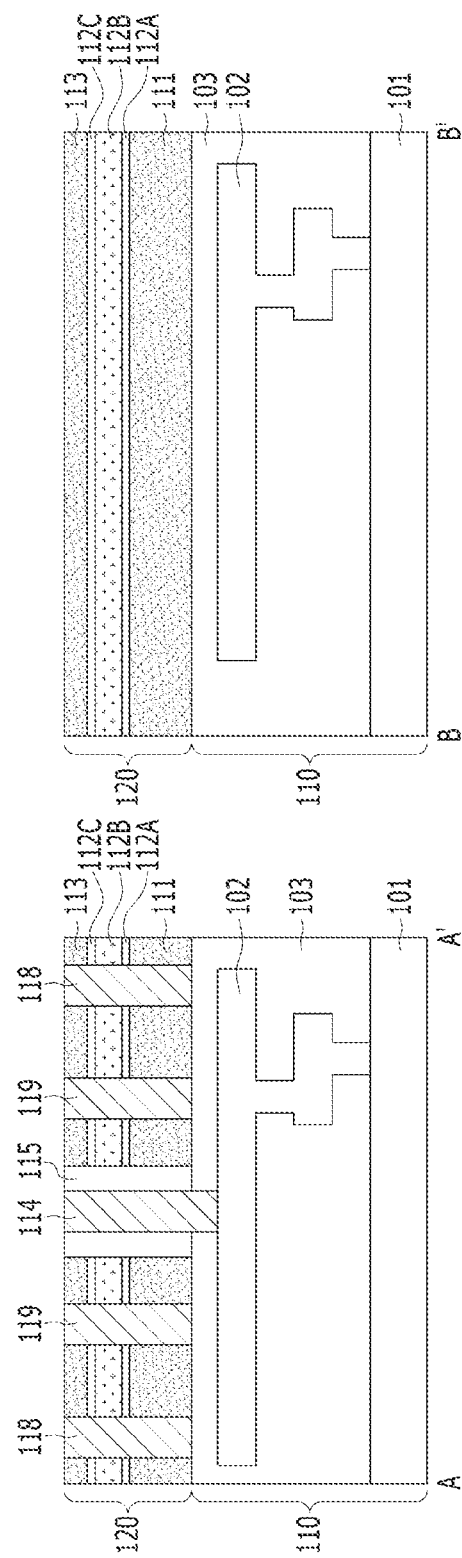

Referring to FIG. 7, after the mask layer 116 is removed, the contact holes 114" and the openings 117A and 117B may be filled with a conductive material. As a result, first contact plugs 114 that fill the contact holes 114" may be formed, and sacrificial pads 118 and 119 that fill the openings 117A and 117B may be formed. The sacrificial pads 118 and 119 may include pillar-type sacrificial pads 118 and line-type sacrificial pads 119. The pillar-type sacrificial pads 118 may fill the hole-type openings (117A in FIG. 6), and the line-type sacrificial pads 119 may fill the line-type openings (117B in FIG. 6).

The first contact plugs 114 and the sacrificial pads 118 and 119 may be formed of the same material. For example, the first contact plugs 114 and the sacrificial pads 118 and 119 may include tungsten. The first contact plugs 114 may be referred to as 'tungsten plugs', and the sacrificial pads 118 and 119 may be referred to as 'tungsten sacrificial pads' or 'tungsten buffers'. For example, in order to form the first contact plugs 114 and the sacrificial pads 118 and 119, a tungsten layer may be deposited before planarization is performed.

The first contact plugs 114 may penetrate the source structure 120 to be electrically connected to the interconnections 102. The sacrificial pads 118 and 119 may penetrate the source structure 120 without being coupled to the interconnections 102. The sacrificial pads 118 and 119 and the interconnections 102 may be electrically disconnected by an inter-layer dielectric layer 103. The first contact plugs 114 may be positioned between the line-type sacrificial pads 119. The line-type sacrificial pads 119 may be formed between the first contact plugs 114 and the hole-type sacrificial pads 118.

Figure 8:
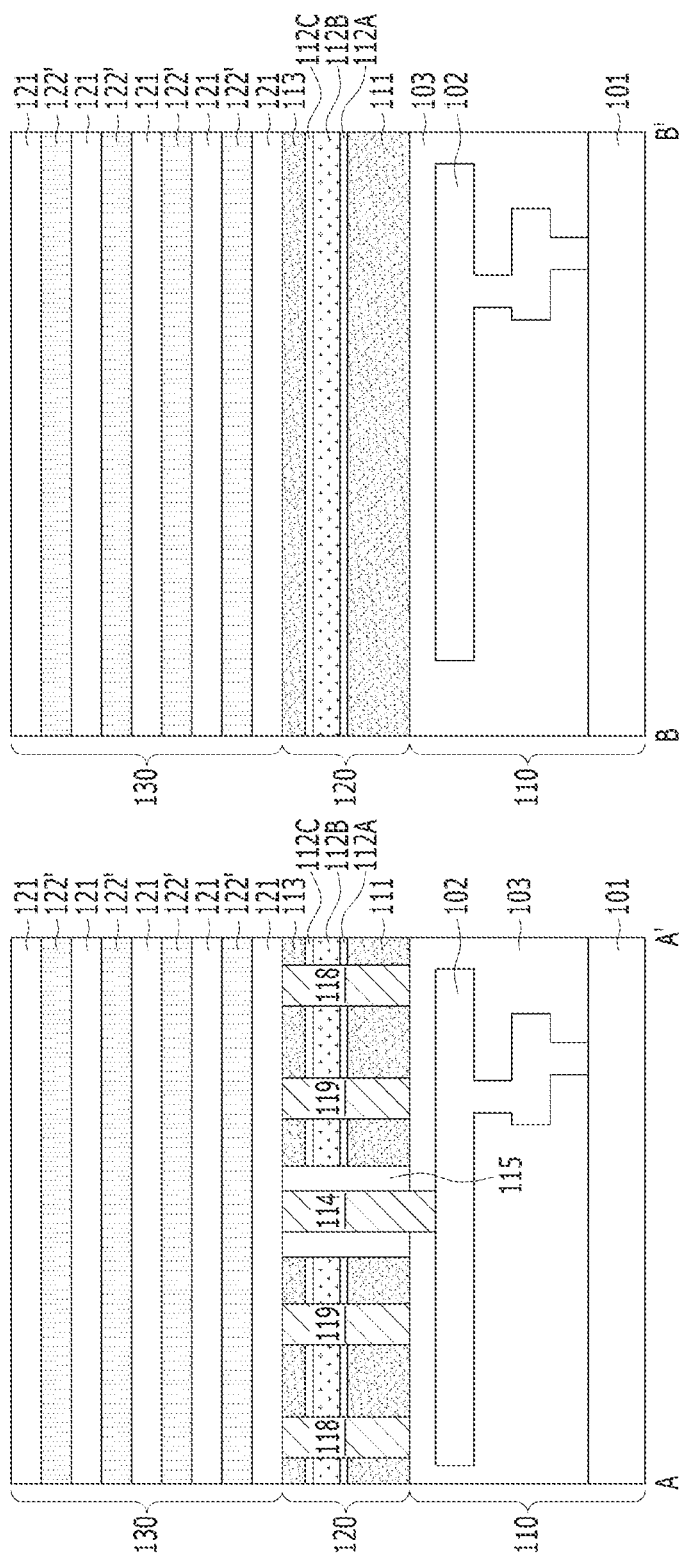

Referring to FIG. 8, an upper structure 130 may be formed over the first contact plugs 114 and the sacrificial pads 118 and 119. The upper structure 130 may include an alternating stack in which dielectric layers 121 and sacrificial layers 122' are alternately stacked. The height of the upper structure 130 may be greater than that of the source structure 120.

The dielectric layer 121 and the sacrificial layer 122' may be formed of different materials. The dielectric layer 121 may have an etch selectivity with respect to the sacrificial layer 122'. The dielectric layer 121 may include silicon oxide, and the sacrificial layer 122' may include silicon nitride. The dielectric layer 121 and the sacrificial layer 122' may have the same thickness. The dielectric layer 121 and the sacrificial layer 122' may be thicker than the liner layers 112A and 112C, and the dielectric layer 121 and the sacrificial layer 122' may be thinner than the source conductive layers 111 and 113.

The dielectric layer 121 and the sacrificial layer 122' may be formed by Chemical Vapor Deposition (CVD) or Atomic Layer Deposition (ALD). According to another embodiment of the present invention, among the dielectric layers 121, the lowermost dielectric layer 121 and the uppermost dielectric layer 121 may be formed to be thicker than the other dielectric layers 121.

The dielectric layer 121 and the liner layers 112A and 112C may be formed of the same material. According to another embodiment of the present invention, the liner layers 112A and 112C may have an etch selectivity with respect to the dielectric layer 121.

Figure 9:
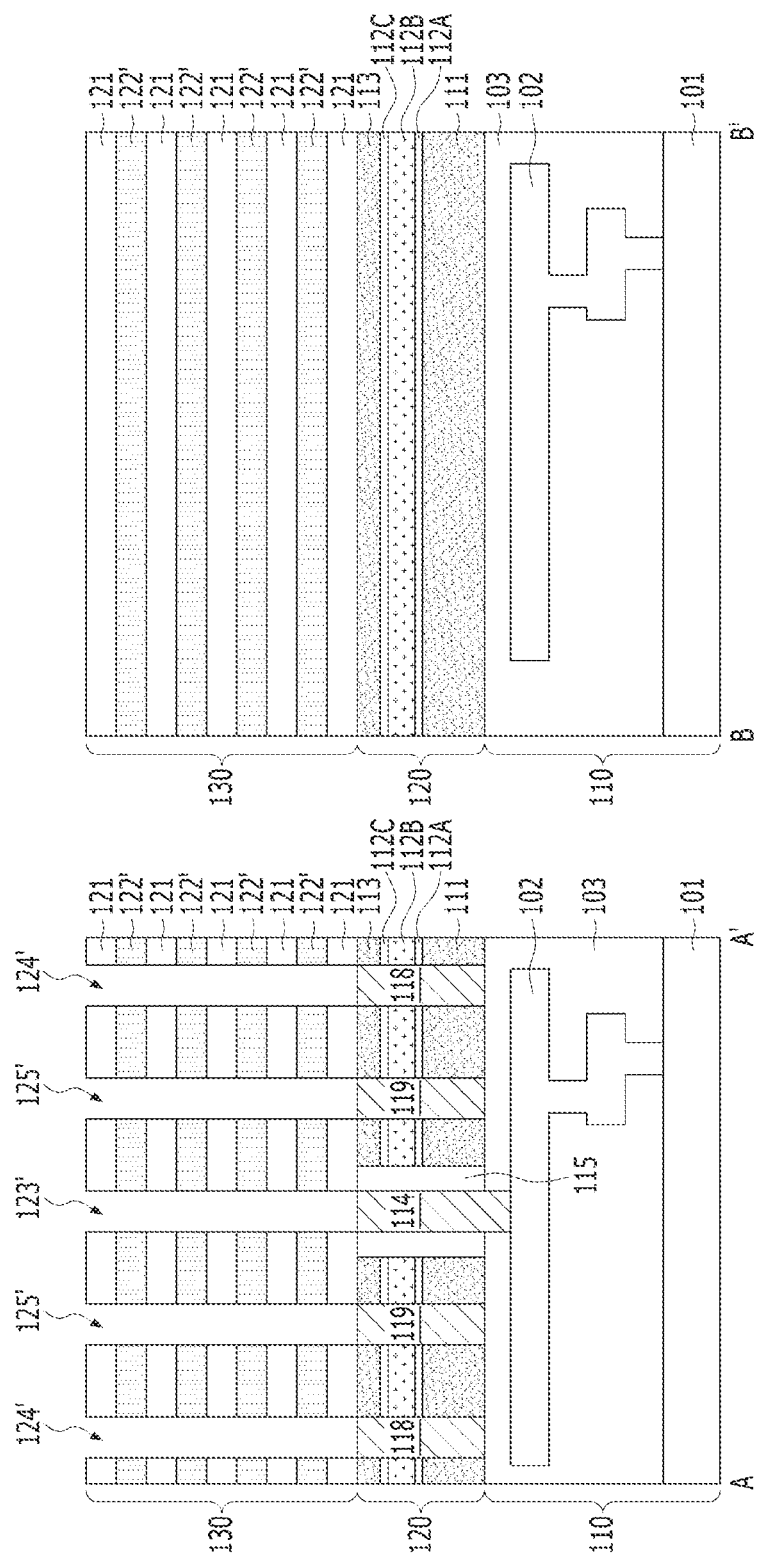

Referring to FIG. 9, a plurality of upper level openings 123', 124', and 125' may be formed in the upper structure 130. The upper level openings 123', 124', and 125' may penetrate the upper structure 130. The upper level openings 123', 124', and 125' may include a first upper level opening 123', a second upper level opening 124', and a third upper level opening 125'. From the perspective of a plan view, the first upper level opening 123' and the second upper level opening 124' may have a hole shape, and the third upper level opening 125' may have a line shape. The first upper level opening 123' may expose the upper surface of the first contact plug 114. The second upper level opening 124' may expose the upper surface of the pillar-type sacrificial pad 118. The bottom surface of the second upper level opening 124' may have a smaller size than the upper surface of the pillar-type sacrificial pad 118. The diameter of the pillar-type sacrificial pad 118 may be greater than the diameter of the second upper level opening 124'. The third upper level opening 125' may expose the upper surface of the line-type sacrificial pad 119. The bottom surface of the third upper level opening 125' may have a smaller size than the upper surface of the line-type sacrificial pad 119. The width of the line-type sacrificial pad 119 may be greater than the width of the third upper level opening 125'.

The upper structure 130 may be etched to form the upper level openings 123', 124', and 125'. While the upper level openings 123', 124', and 125' are being formed, the sacrificial pads 118 and 119 may serve as an etch stop layer. Accordingly, the loss of the lower structure 110 that is caused by etch loading between the upper level openings 123', 124', and 125' may be prevented. For example, the second upper level opening 124' in a hole shape and the third upper level opening 125' in a line shape may cause etch loading between the two, and thus, the depth of the third upper level opening 125' may extend farther. As a comparative example, when the sacrificial pads 118 and 119 are omitted, the third upper level opening 125' may penetrate the inter-layer dielectric layer 103 to expose the interconnections 102. Also, in the comparative example, since the interconnections 102 are exposed, the interconnections 102 may be stripped in subsequent process. On the other hand, according to the embodiments of the present invention, the sacrificial pads 118 and 119 may serve as an etch stop layer to protect the lower structure 110 from being damaged and also may protect the interconnections 102 from subsequent processes. The second upper level opening 124' and the third upper level opening 125' may be referred to as sacrificial openings.

Figure 10:
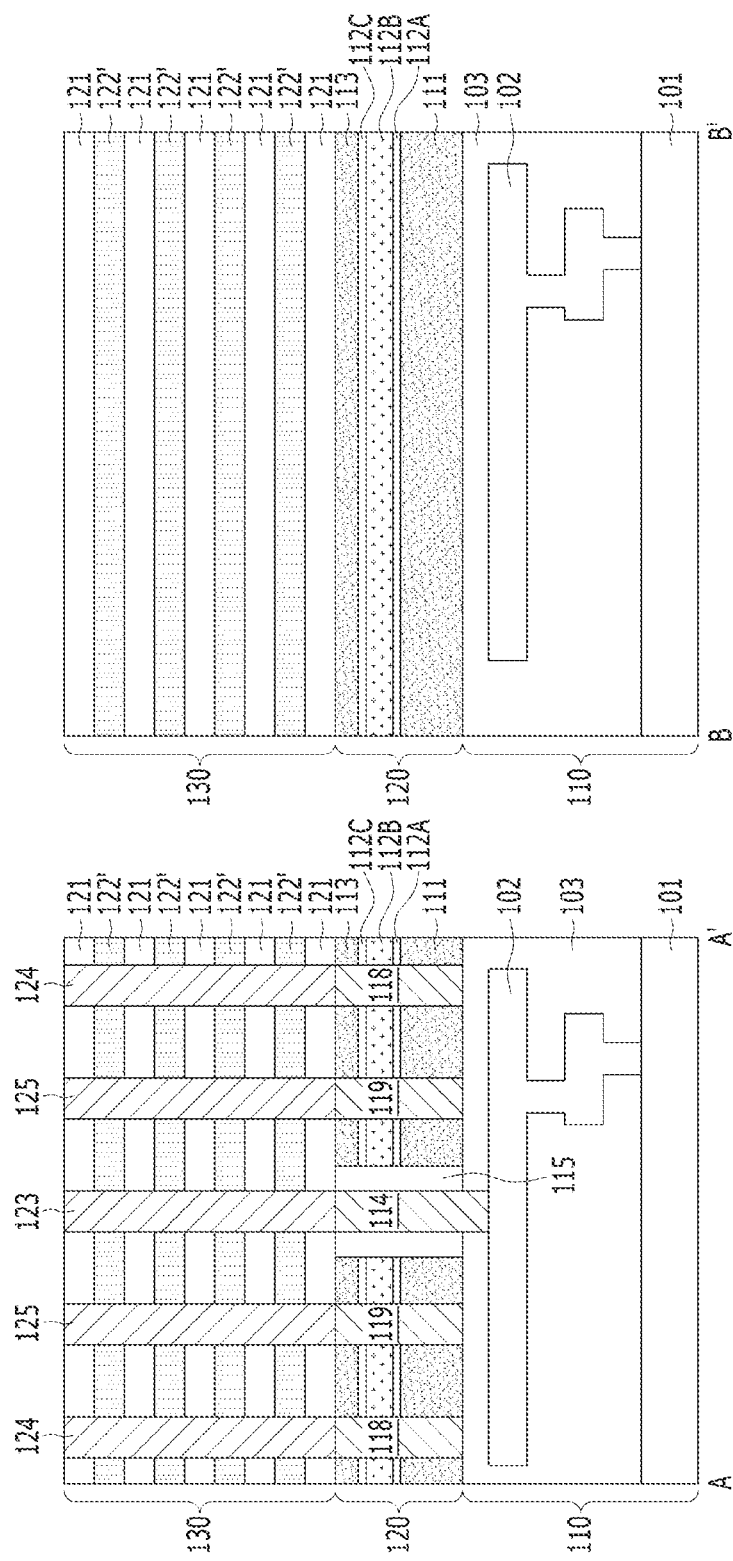

Referring to FIG. 10, a second contact plug 123 that fills the first upper level opening 123' may be formed. The second contact plug 123 may include a metal-based material. The second contact plug 123 may include tungsten. For example, the second contact plug 123 may be formed by depositing a tungsten layer to fill the first upper level opening 123' before going through a planarization process, such as Chemical Mechanical Polishing (CMP). While the second contact plug 123 is being formed, dummy sacrificial pads 124 and 125 may be formed in the second upper level opening 124' and the third upper level opening 125'. The dummy sacrificial pads 124 and 125 may include tungsten. The dummy sacrificial pad 124 may have a pillar shape, and the dummy sacrificial pad 125 may have a line shape. The dummy sacrificial pads 124 and 125 may be referred to as dummy contact plugs. The dummy sacrificial pads 124 and 125 may physically contact the upper surfaces of the sacrificial pads 118 and 119. According to another embodiment of the present invention, the sacrificial pads 118 and 119 may be referred to as first sacrificial pads, and the dummy sacrificial pads 124 and 125 may be referred to as second sacrificial pads. The dummy sacrificial pads 124 and 124 and the sacrificial pads 118 and 119 may be metal pads.

Figure 11:
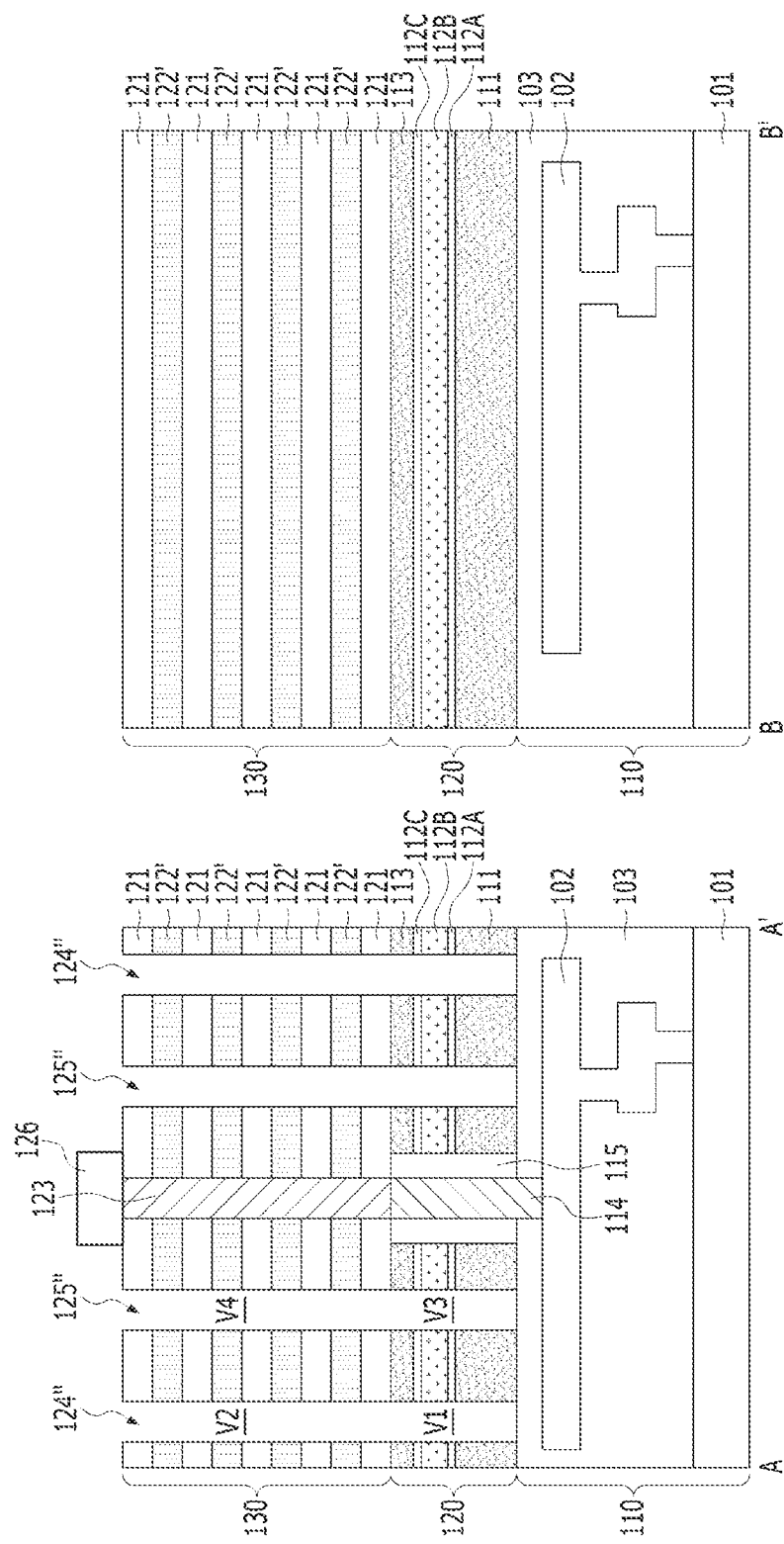

Referring to FIG. 11, the dummy sacrificial pads 124 and 125 may be selectively removed. After the mask layer 126 is formed over the second contact plug 123, the dummy sacrificial pads 124 and 125 may be removed. While the dummy sacrificial pads 124 and 125 are being removed, the second contact plug 123 may be protected by the mask layer 126.

After the dummy sacrificial pads 124 and 125 are removed, the sacrificial pads 118 and 119 may be removed. As a result, a plurality of support openings 124" and 125" may be formed in the upper structure 130. The support openings 124" and 125" may include a hole-type support opening 124" and a line-type support opening 125". The hole-type support opening 124" may be a space from which the dummy sacrificial pad 124 and the pillar-type sacrificial pad 118 are removed. The line-type support opening 125" may be a space from which the dummy sacrificial pad 125 and the line-type sacrificial pad 119 are removed. The hole-type support opening 124" and the line-type support opening 125" may penetrate the upper structure 130 and the source structure 120. The hole-type support opening 124" and the line-type support opening 125" may be vertically oriented in relation to the lower structure 110.

The hole-type support opening 124" may include a first portion V1 that penetrates the source structure 120 and a second portion V2 that penetrates the upper structure 130. The second portion V2 may be positioned over the first portion V1. The first portion V1 and the second portion V2 may be vertically coupled, and the width (or diameter) of the first portion V1 may be greater than the width (or diameter) of the second portion V2. From the perspective of a plan view, the first portion V1 and the second portion V2 may have a hole shape.

The line-type support opening 125" may include a third portion V3 that penetrates the source structure 120 and a fourth portion V4 that penetrates the upper structure 130. The fourth portion V4 may be positioned over the third portion V3. The third portion V3 and the fourth portion V4 may be vertically coupled, the width of the third portion V3 may be greater than the width of the fourth portion V4. From the perspective of a plan view, the third portion V3 and the fourth portion V4 may have a line shape.

Figure 12:
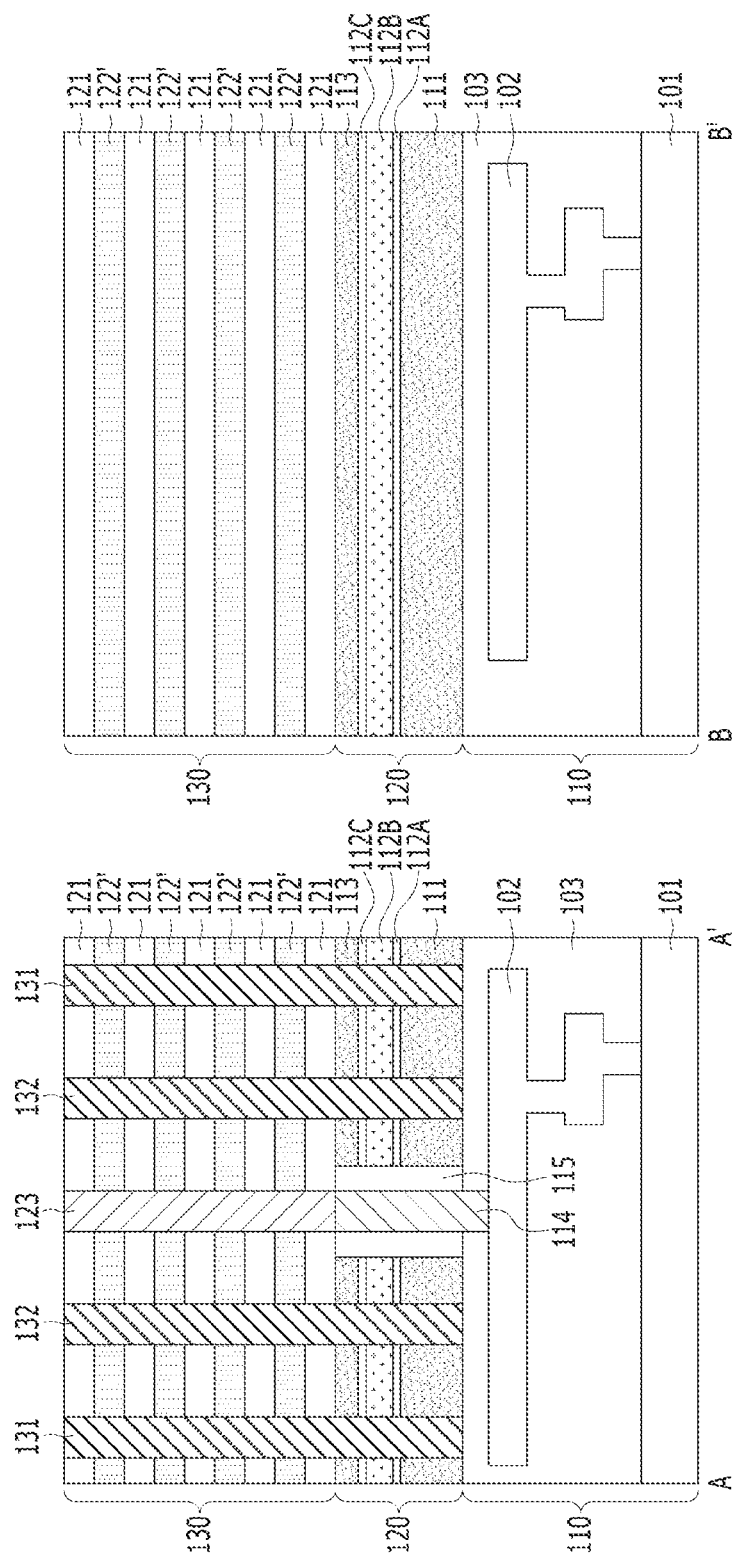

Referring to FIG. 12, a plurality of supporters 131 and 132 may be formed. The supporters 131 and 132 may be formed by depositing and etching a dielectric material that fills the supporter openings 124" and 125" in FIG. 11. The supporters 131 and 132 may include silicon oxide.

The supporters 131 and 132 may include a pillar-type supporter 131 and a line-type supporter 132. The pillar-type supporter 131 may fill the hole-type support opening (124" in FIG. 11), and the line-type supporter 132 may fill the line-type support opening (125" in FIG. 11).

The pillar-type supporter 131 and the line-type supporter 132 may have different shapes. The pillar-type supporter 131 may fill the first portion V1 and the second portion V2 of the hole-type support opening (124" in FIG. 11). The line-type supporter 132 may fill the third portion V3 and the fourth portion V4 of the line-type support opening (125" in FIG. 11).

The pillar-type supporter 131 and the line-type supporter 132 may be referred to as silicon oxide supporters. According to another embodiment of the present invention, the pillar-type supporter 131 and the line-type supporter 132 may include a material with an etch selectivity with respect to the sacrificial layers 122'. The pillar-type supporter 131 and the line-type supporter 132 may include $SiO_2$, SiCO, SiCN, SiBN, or SiBCN.

Referring to FIGS. 7 to 12, the sacrificial pads 118 and 119 and the dummy sacrificial pads 124 and 125 may be replaced with the supporters 131 and 132.

Figure 13:
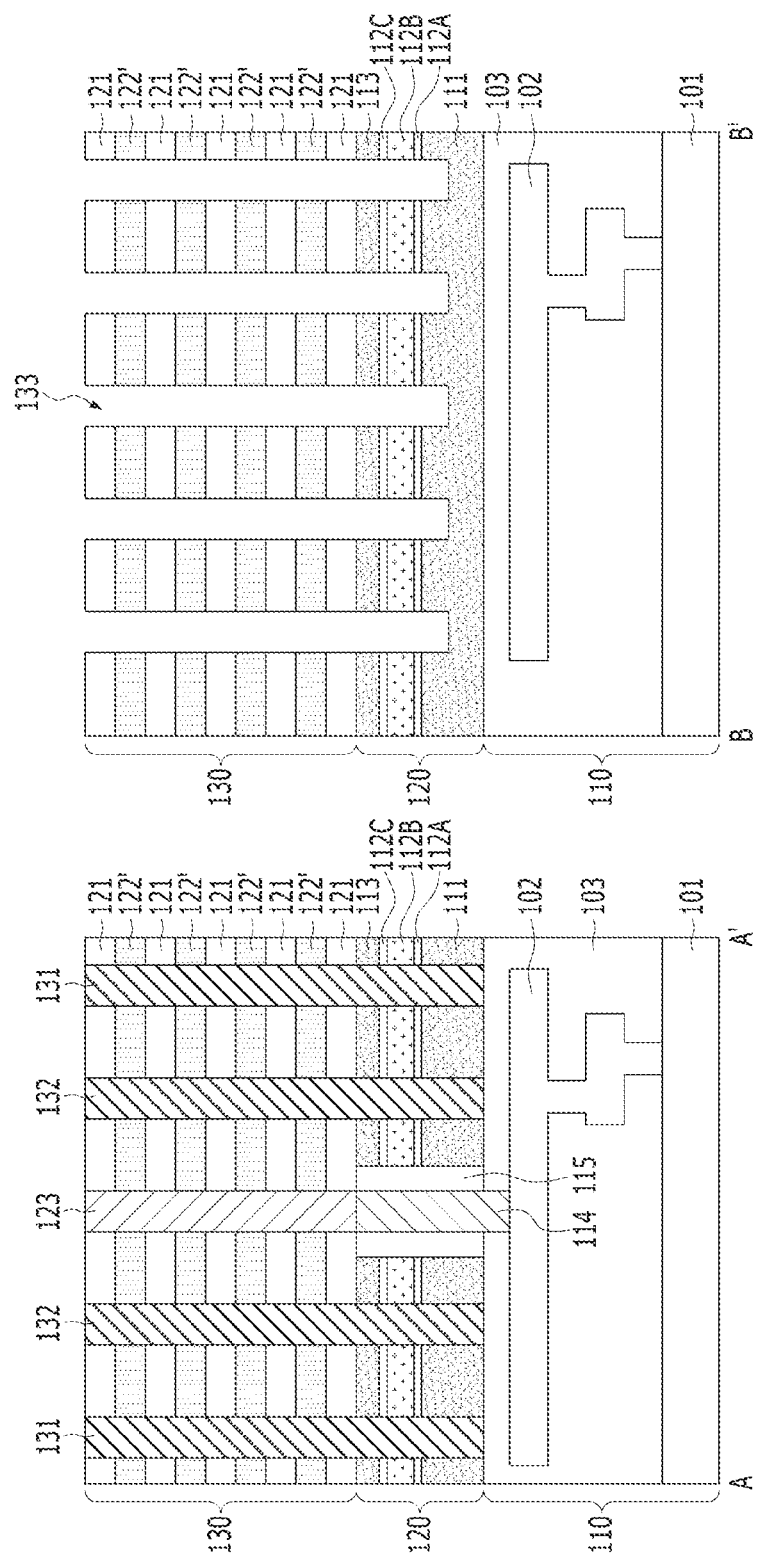

Referring to FIG. 13, a vertical opening 133 may be formed. To form the vertical opening 133, the etching of the upper structure 130 and the etching of the source structure 120 may be sequentially performed. The vertical opening 133 may be formed in the cell array region AR and might not be formed in the contact region CR. Although not illustrated, during the etching process for forming the vertical opening 133, the contact region CR may be protected by a mask layer.

The vertical opening 133 may be formed to be perpendicular to the surface of the lower structure 110. The vertical opening 133 may completely penetrate the upper structure 130 and may partially penetrate the source structure 120. For example, the vertical opening 133 may completely penetrate the source conductive layer 113, the liner layers 112A and 112C, and the sacrificial source layer 112B, while only partially penetrating the source conductive layer 111. According to another embodiment of the present invention, the vertical opening 114 may be referred to as a 'vertical recess, a through hole, a vertical hole, or a channel hole'. Although not illustrated, from the perspective of a plan view, a plurality of vertical openings 133 may be formed in a hole array structure.

Figure 14:
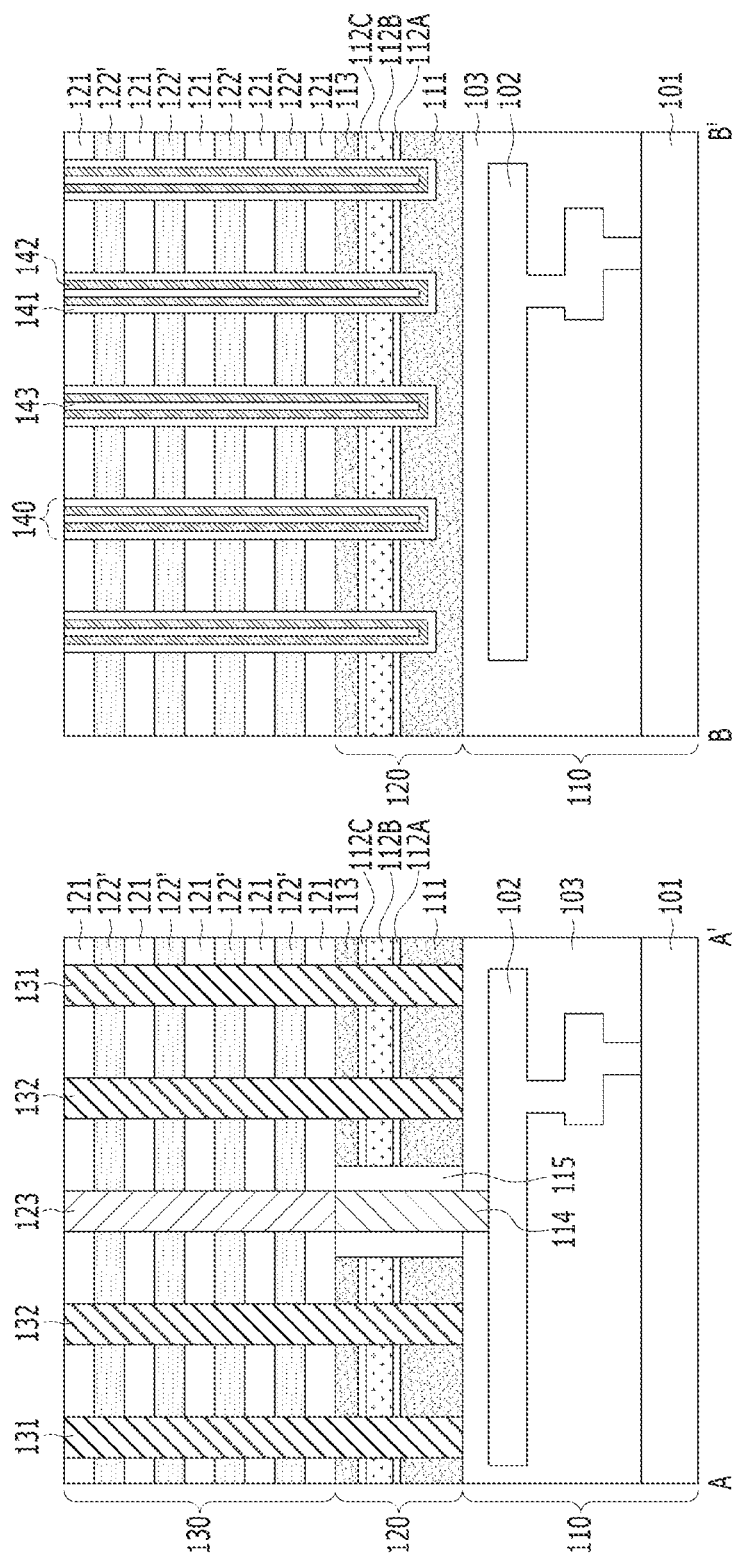

Referring to FIG. 14, a channel structure 140 may be formed in the vertical opening 133. The channel structure 140 may have a pillar shape that fills the vertical opening 133.

The channel structure 140 may include a memory layer 141 and a channel layer 142. The memory layer 141 may include an ONO structure. The ONO structure may include a stack of an oxide, a nitride, and an oxide. The memory layer 141 may include a stack of a blocking layer, a charge trapping layer, and a tunnel dielectric layer. The blocking layer and the tunnel dielectric layer may include an oxide, and the charge trapping layer may include a nitride. The channel layer 142 may include a polysilicon layer. According to another embodiment of the present invention, the blocking layer may include a high-k material, and the high-k material may include aluminum oxide or hafnium oxide.

The channel layer 142 may have a cylinder shape with an inner space. The memory layer 141 may surround the outer wall of the channel layer 142.

The channel structure 140 may further include a core dielectric layer 143. The inner space of the channel layer 142 may be completely filled with the core dielectric layer 143. The core dielectric layer 143 may include silicon oxide or silicon nitride. Although not illustrated, a conductive pad that is coupled to the upper end of the channel layer 142 may be further formed after the core dielectric layer 143 is recessed.

Figure 15:
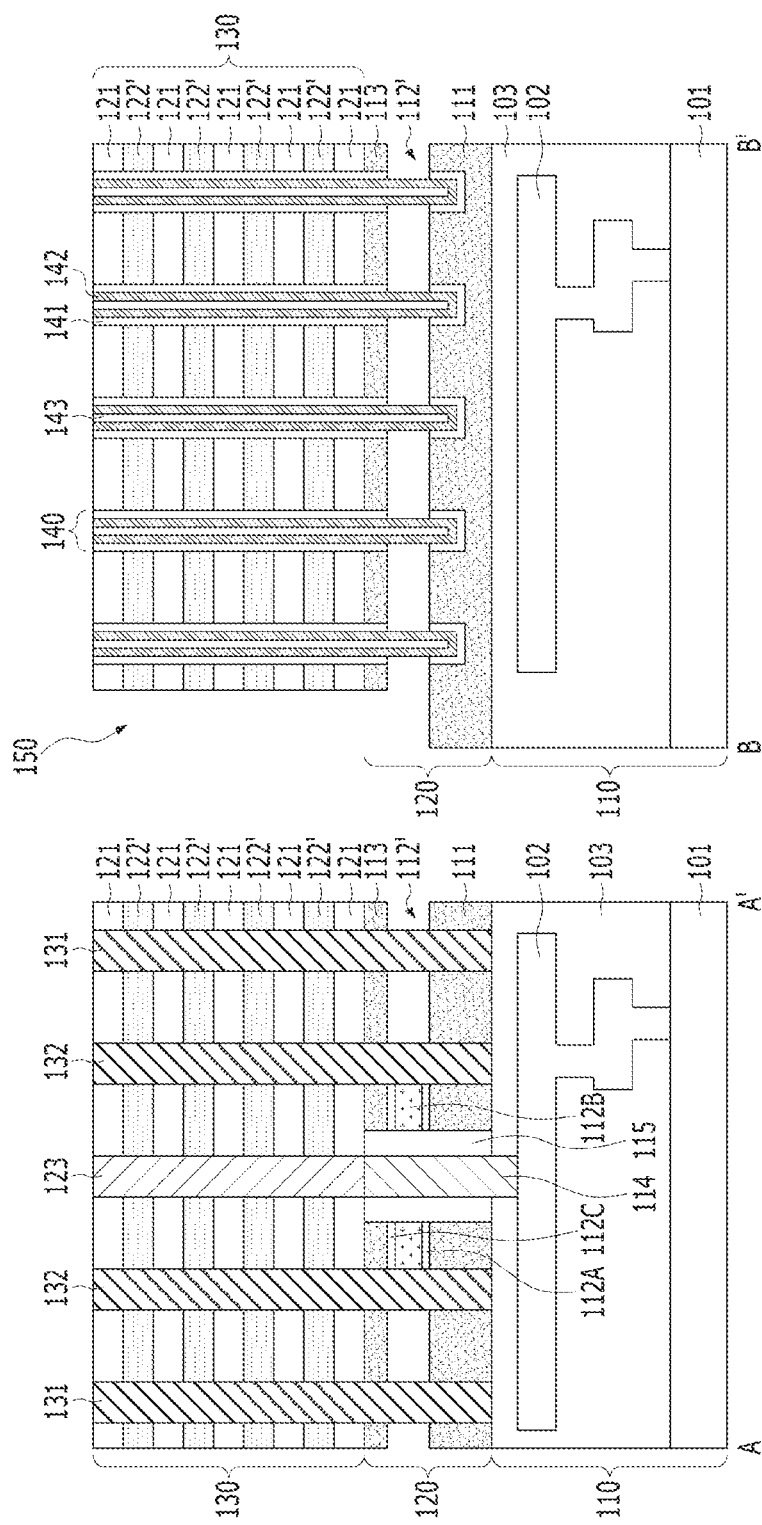

Referring to FIG. 15, a vertical slit 150 may be formed. The vertical slit 150 may be formed to be spaced apart from the channel structure 140. The vertical slit 150 may be formed by etching the upper structure 130, and the vertical slit 150 may extend downward to a portion of the source structure 120. The bottom surface of the vertical slit 150 may penetrate the source conductive layer 113 and the liner layer 112C. The etching process that forms the vertical slit 150 may stop over the sacrificial source layer 112B. According to another embodiment of the present invention, while the vertical slit 150 is being formed, the upper surface of the sacrificial source layer 112B may be partially recessed. The vertical slit 150 may also be referred to as a slit or trench. From the perspective of a plan view, the vertical slit 150 may have a line shape that extends in one direction. The vertical slit 150 may have a high aspect ratio that is perpendicular to the surface of the lower structure 110.

Subsequently, a source level opening 112' may be formed. The sacrificial source layer 112B may be selectively removed to form the source level opening 112'.

The source level opening 112' may partially expose the outer walls of the supporters 131 and 132. The source level opening 112' may be positioned between the source conductive layers 111 and 113. The source level opening 112' might not expose the first contact plug 114. The first contact plug 114 may be protected from the source level opening 112' by the spacer 115.

A portion of the source level opening 112' may expose the lower sidewall of the channel structure 140. The source level opening 112' may have an annular-shape that surrounds the lower sidewall of the channel structure 140. The source level opening 112' may be referred to as a source-level air gap.

Subsequently, the liner layers 112A and 112C may be selectively removed. While the liner layers 112A and 112C are being removed, portions of the channel structure 140 may be removed. For example, a portion of the memory layer 141 may be removed to expose a portion of the channel layer 142. The source level opening 112' and the channel layer 142 may directly contact each other.

Figure 16:
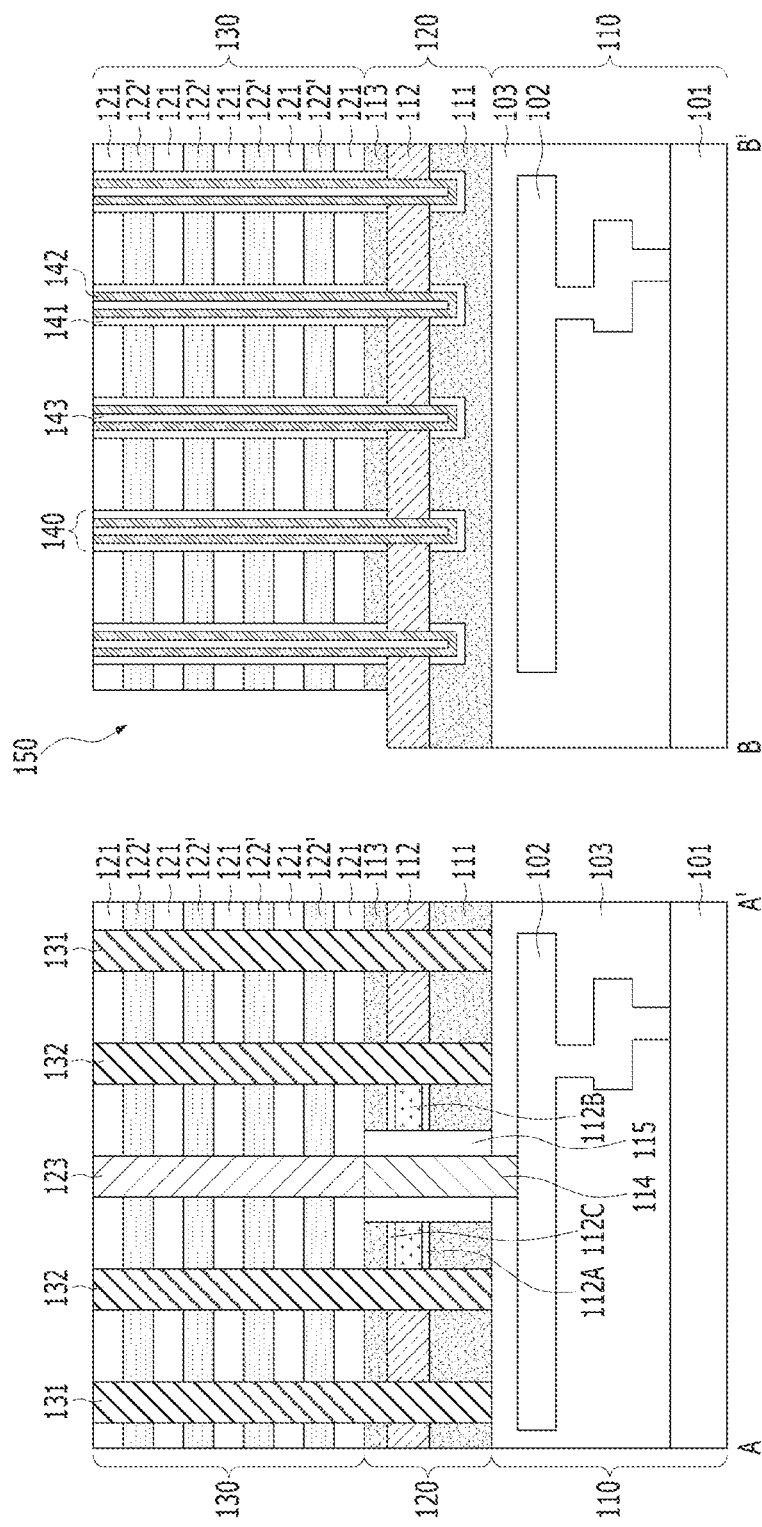

Referring to FIG. 16, a source level contact layer 112 filling the source level opening 112' may be formed. The source level contact layer 112 may include a conductive material. The source level contact layer 112 may include polysilicon. The source level contact layer 112 may be doped with a conductive impurity, such as phosphorus, arsenic, boron, or the like. For example, the source level contact layer 112 may include phosphorus-doped polysilicon. According to another embodiment of the present invention, the source level contact layer 112 may be doped with a non-conductive impurity or a conductive impurity and a non-conductive impurity. For example, the source level contact layer 112 may include polysilicon that is doped with carbon. According to another embodiment of the present invention, the source-level contact layer 112 may include two layers of phosphorus-doped polysilicon and carbon-doped polysilicon. The first contact plug 114 and the source level contact layer 112 may be insulated by a spacer 115. The source level contact layer 112 and the source conductive layers 111 and 113 may contact each other. The source level contact layer 112 and the source conductive layers 111 and 113 may be referred to as a source level layer.

Figure 17:
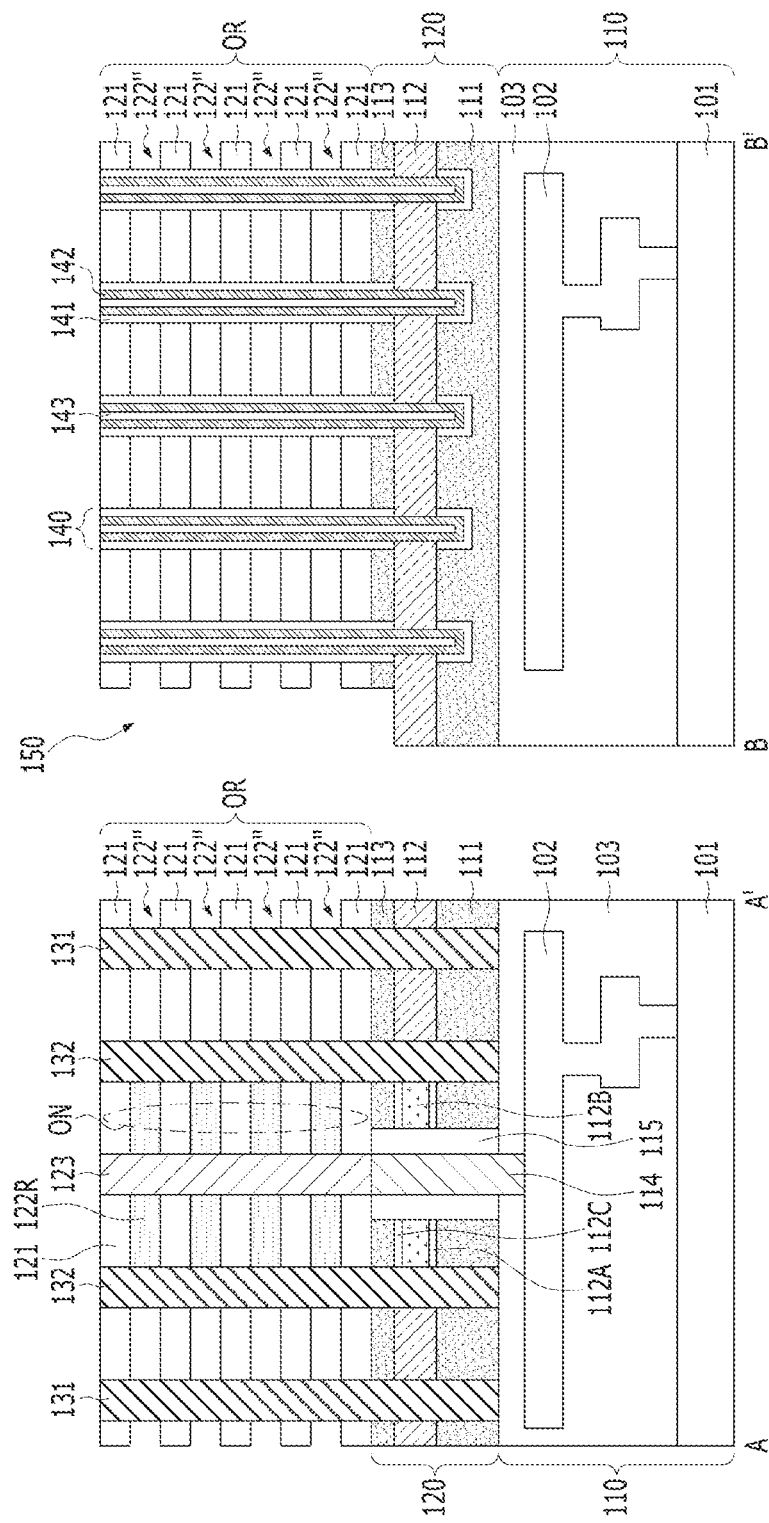

Referring to FIG. 17, the sacrificial layers 122' of the upper structure 130 may be selectively removed. As a result, lateral recesses 122" may be formed between the dielectric layers 121. The lateral recesses 122" may be referred to as lateral air gaps. The lateral recesses 122" and the dielectric layers 121 may form a preliminary stack OR. The preliminary stack OR may be formed by alternately stacking the dielectric layers 121 and the lateral recesses 122". When the sacrificial layer 122' includes silicon nitride, the sacrificial layer 122' may be removed by a chemical with phosphoric acid ($H_3PO_4$).

The second contact plug 123 may be supported by the first upper stack ON. The first upper stack ON may be formed by alternately stacking the dielectric layers 121 and the sacrificial layers 122'. A portion of the sacrificial layers 122' might not be removed by the line-type supporters 132 during an etching process that forms the lateral recesses 122". The remaining portion of the sacrificial layers 122' may be simply referred to as a gate-level dielectric layer 122R. The gate-level dielectric layer 122R may remain between the line-type supporters 132, and the gate-level dielectric layers 122R and the dielectric layers 121 may form the first upper stack ON. When the gate-level dielectric layers 122R include silicon nitride and the dielectric layers 121 include silicon oxide, the first upper stack ON may be an alternating stack in which silicon oxides and silicon nitrides are alternately stacked. The first upper stack ON may be supported by the line-type supporters 132. The line-type supporters 132 may have a shape that penetrates the first upper stack ON and the source structure 120.

Figure 18:
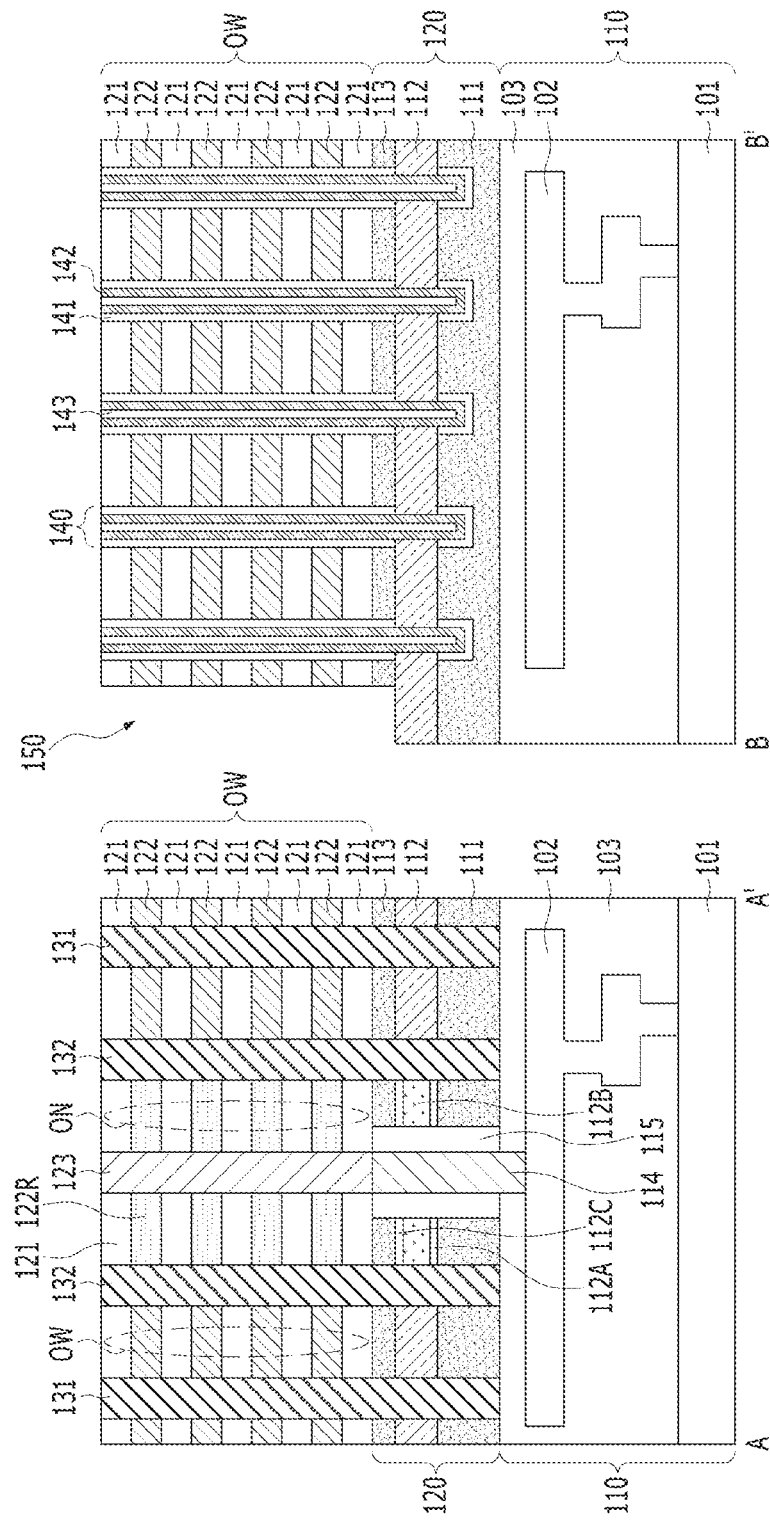

Referring to FIG. 18, gate electrodes 122 may be formed. The gate electrodes 122 may respectively fill the lateral recesses 122" of the preliminary stack OR. The dielectric layers 121 and the gate electrodes 122 may form a second upper stack OW. The second upper stack OW may be formed by alternately stacking the dielectric layers 121 and the gate electrodes 122. The second upper stack OW may be supported by the pillar-type supporters 131. The pillar-type supporters 131 may have a shape that penetrates the second upper stack OW and the source structure 120. The first upper stack ON may be positioned between the neighboring second upper stacks OW.

The gate electrodes 122 may include a low resistance material. The gate electrodes 122 may be a metal-based material. The gate electrodes 122 may include a metal, a metal silicide, a metal nitride, or a combination thereof. For example, the metal may include nickel, cobalt, platinum, titanium, tantalum or tungsten. The metal silicide may include nickel silicide, cobalt silicide, platinum silicide, titanium silicide, tantalum silicide, or tungsten silicide. The gate electrodes 122 may include a stack of titanium nitride and tungsten.

Referring to FIGS. 17 and 18, the sacrificial layers 122' may be replaced with the gate electrodes 122.

Figure 19:
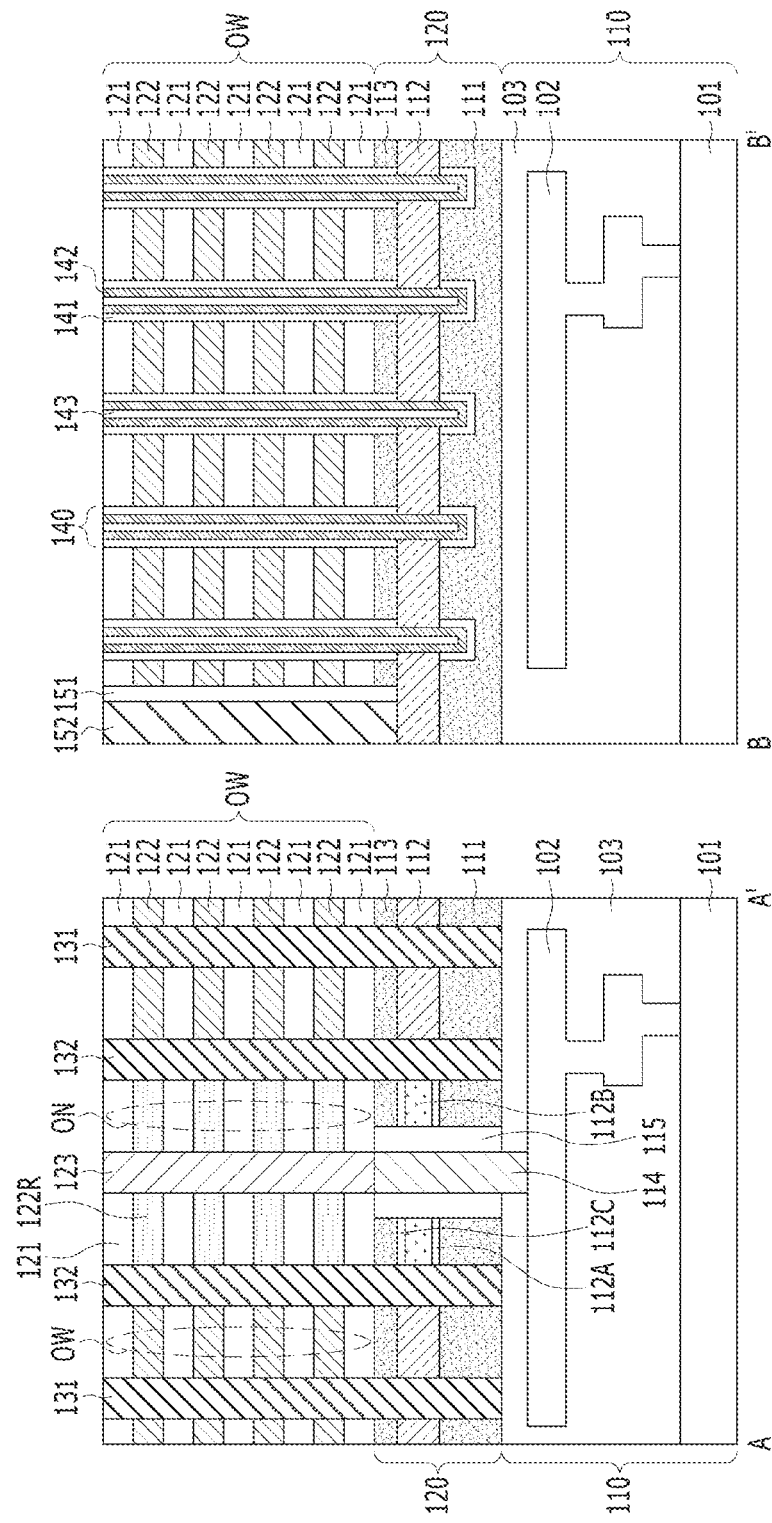

Referring to FIG. 19, the sidewall of the vertical slit 150 may be sealed. The sidewall of the vertical slit 150 may be sealed by a sealing layer 151. The sealing layer 151 may seal the ends of the gate electrodes 122. The sealing layer 151 may seal the sides of the dielectric layers 121. The sealing layer 151 may seal a side of the source conductive layer 113. The sealing layer 151 may include a silicon oxide-based material. The sealing layer 151 may include a low-k material. According to another embodiment of the present invention, the sealing layer 151 may include a material with wet etching resistance in subsequent processes. The sealing layer 151 may include SiCN, SiBCN, SiBN, or a combination thereof.

Subsequently, the source contact plug 152 may be formed in the vertical slit 150. The source contact plug 152 may fill the vertical slit 150. The source contact plug 152 may include a stack of a silicon-containing material and a metal-containing material, and may further include a barrier material between the silicon-containing material and the metal-containing material. The silicon-containing material may include polysilicon, and the metal-containing material may include tungsten. The barrier material may include titanium nitride. According to another embodiment of the present invention, the source contact plug 152 may be formed of tungsten alone.

FIGS. 20 to 23 illustrate another example of a method for fabricating a semiconductor device in accordance with an embodiment of the present invention. The method of fabricating a semiconductor device in accordance with an embodiment of the present invention, shown in FIGS. 20 to 23, may be similar to the fabrication method that is illustrated in FIGS. 3 to 19. The reference numerals of FIGS. 20 to 23, also appearing in FIGS. 3 to 19, denote the corresponding elements, and detailed description with regard to the corresponding elements will be omitted herein.

Referring to FIGS. 3 to 6, a plurality of openings 117A and 117B may be formed in the source structure 120 by an etching process that is performed by using the mask layer 116. The openings 117A and 117B may include hole-type openings 117A and line-type openings 117B. The line-type openings 117B may be positioned on both sides of the contact hole 114". The contact hole 114" may be positioned between the line-type openings 117B. The hole-type openings 117A may be positioned to be spaced apart from the line-type openings 117B. The line-type openings 117B may be positioned between the contact holes 114" and the hole-type openings 117A.

Figure 20:
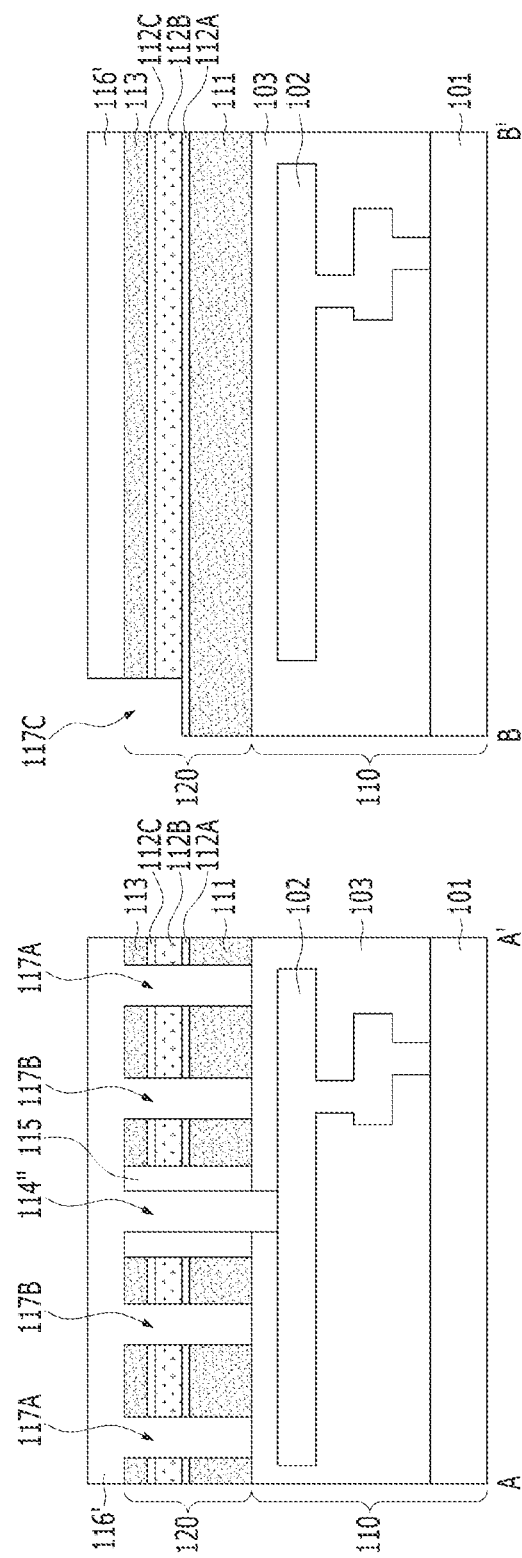
FIGS. 20 to 23 illustrate another example of a method for fabricating a semiconductor device in accordance with an embodiment of the present invention.

After the mask layer 116 is removed, a pre-slit opening 117C may be formed by etching the source structure 20 by using a mask layer 116', as illustrated in FIG. 20. The pre-slit opening 117C may have a line shape. The mask layer 116' may block the openings 117A and 117B.

According to another embodiment of the present invention, while the openings 117A and 117B are being formed, the pre-slit opening 117C may be simultaneously formed. In this case, the mask layer 116 may be used as an etching mask.

Figure 21:
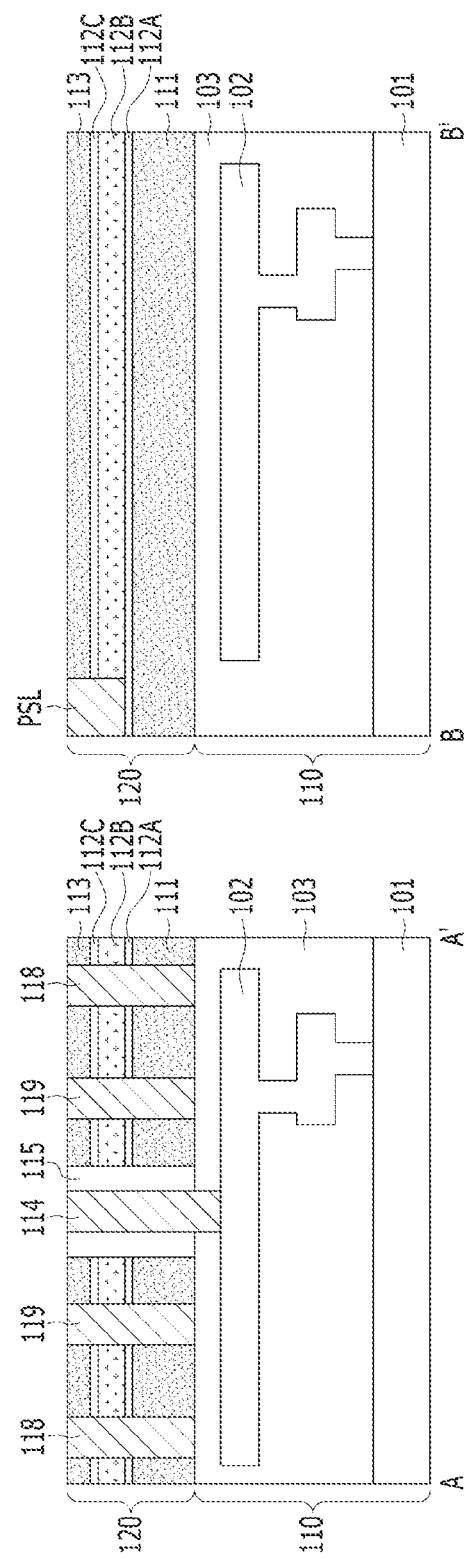

Referring to FIG. 21, after the mask layer 116' is removed, an additional sacrificial pad PSL that fills the pre-slit opening 117C may be formed. First contact plugs 114 that fills the contact holes 114" may be formed, and sacrificial pads 118 and 119 that fills the openings 117A and 117B may be formed. The sacrificial pads 118 and 119 may include pillar-type sacrificial pads 118 and line-type sacrificial pads 119. The pillar-type sacrificial pads 118 may fill a hole-type opening (117A in FIG. 20). The line-type sacrificial pads 119 may fill the line-type opening (117B of FIG. 20). An additional sacrificial pad PSL, the first contact plugs 114, the pillar-type sacrificial pads 118, and the line-type sacrificial pads 119 may be of the same material. The additional sacrificial pad PSL, the first contact plugs 114, the pillar-type sacrificial pads 118, and the line-type sacrificial pads 119 may be formed simultaneously. For example, a tungsten layer that fills the pre-slit opening 117C, the contact hole 114", the line-type openings 117B, and the hole-type openings 117A may be deposited before the tungsten layer may be planarized. The additional sacrificial pad PSL, the pillar-type sacrificial pads 118, and the line-type sacrificial pads 119 may be referred to as a 'tungsten sacrificial pad' or a 'tungsten buffer'.

Thereafter, a series of processes as described to in FIGS. 8 to 14 may be performed.

Figure 22:
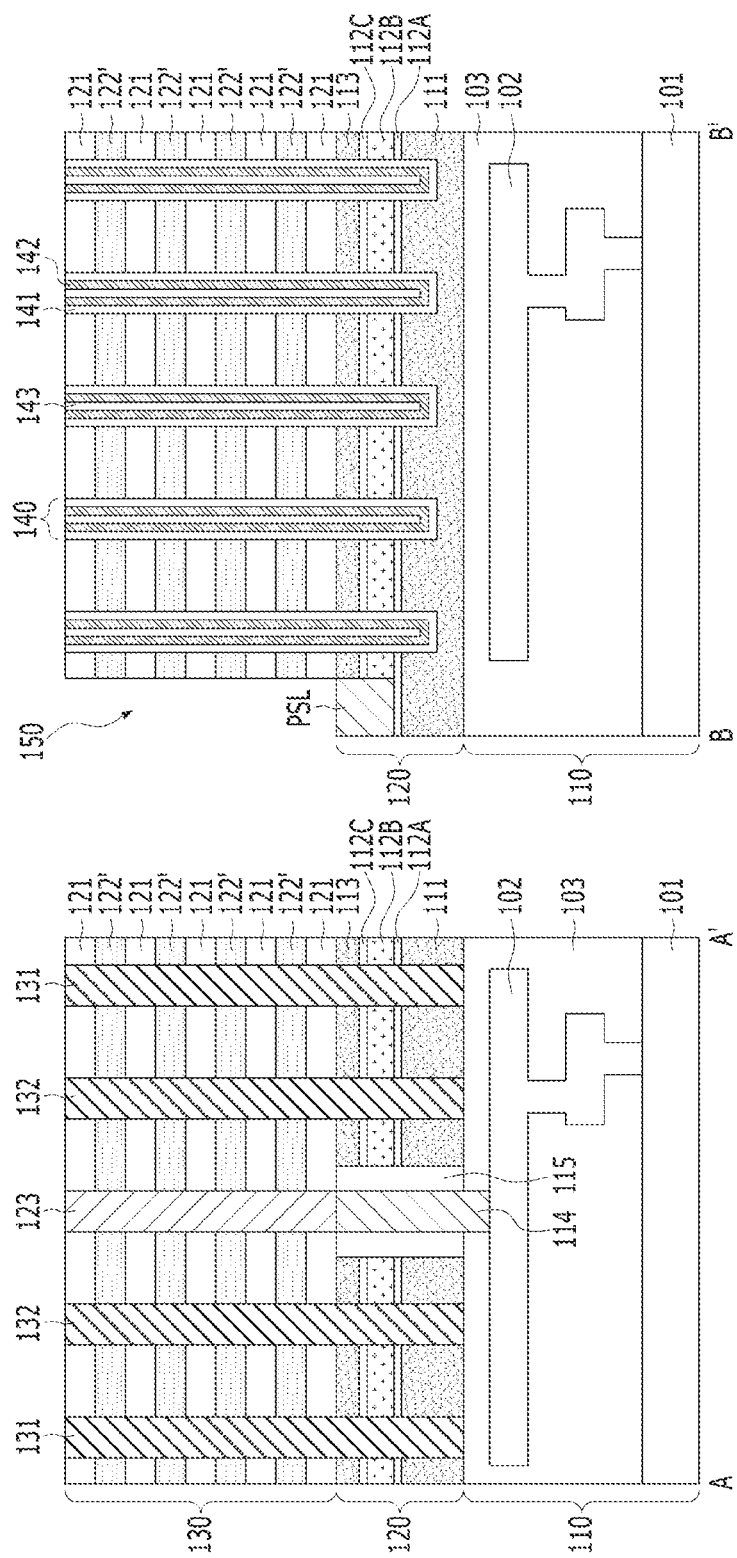

Subsequently, as illustrated in FIG. 22, a vertical slit 150 may be formed. During the etching process that forms the vertical slit 150, the additional sacrificial pad PSL may serve as an etch stop layer. The etching process of the upper structure 130 that forms the vertical slit 150 may be a high aspect ratio etching process, and the etching of the upper structure 130 may stop at the additional sacrificial pad PSL.

As described above, by forming the additional sacrificial pad PSL, the thickness of the source conductive layer 113 may be made to be thin.

Figure 23:
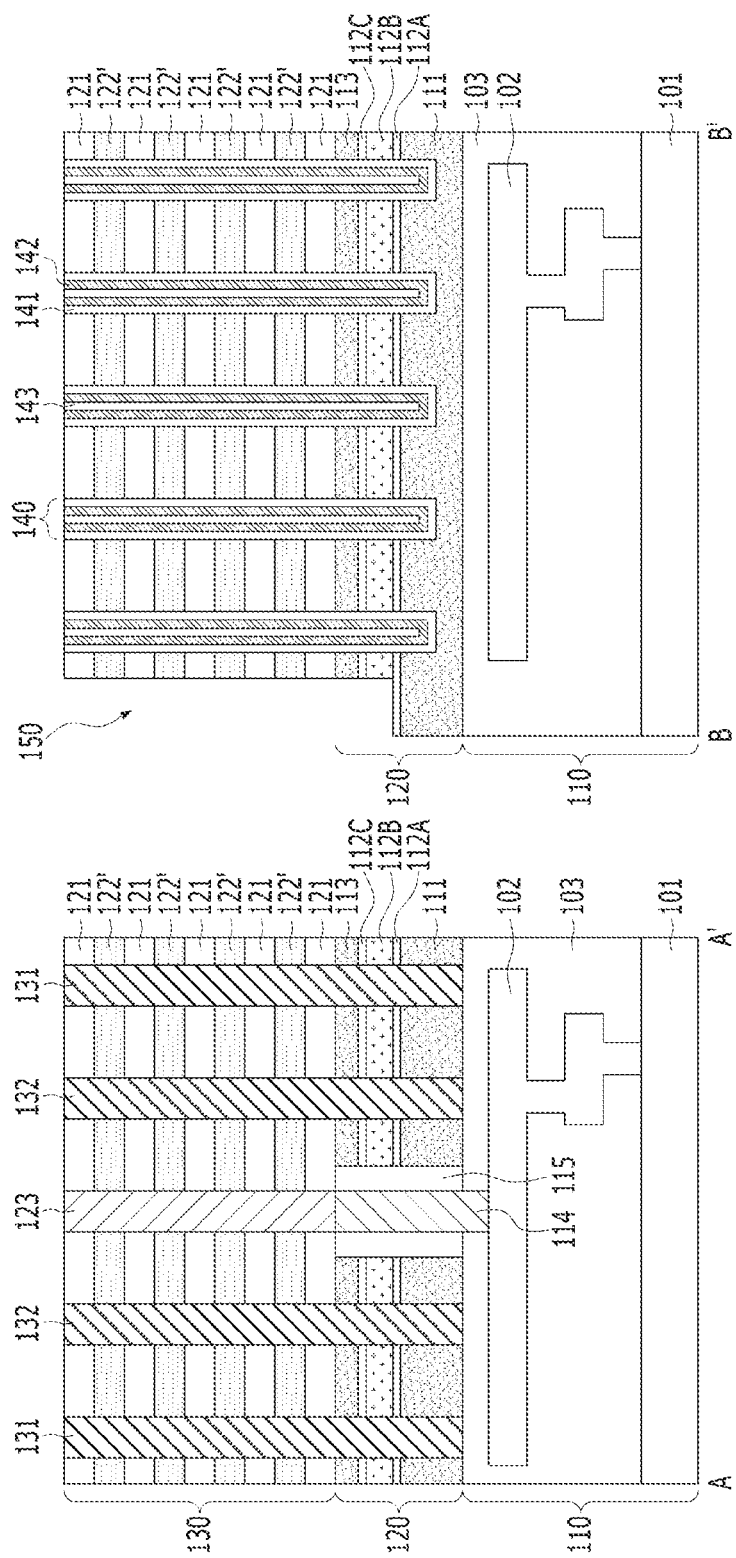

Referring to FIG. 23, the additional sacrificial pad PSL may be removed.

Subsequently, as illustrated in FIG. 15, the sacrificial source layer 112B may be removed to form the source level opening 112'.

Subsequently, a series of processes, described in FIGS. 16 to 19, may be performed.

Referring to FIGS. 20 to 23, a method for fabricating a semiconductor device may include: forming a source structure 120 that includes a sacrificial source layer over a lower structure with interconnections 102, forming a first contact plug 114 that penetrates the source structure 120 to be coupled to the interconnections 120, and an additional sacrificial pad PSL that is spaced apart from the first contact plug 114 and penetrates a portion of the source structure 120, forming an alternating stack of dielectric layers 121 and sacrificial layers 122' over the additional sacrificial pad PSL and the source structure 120, forming a second plug 123 that penetrates the alternating stack and physically contacts the first contact plug 114, forming a plurality of channel structures 140 that penetrate the alternating stack and the source structure to be spaced apart from the second contact plug, forming a vertical slit 150 by etching the alternating stack to stop at the additional sacrificial pad PSL, removing the additional sacrificial pad PSL, and forming a source level opening 112' by selectively removing the sacrificial source layer 112B of the source structure 120.

According to the embodiment of the present invention, it is possible to prevent a bridge between the contact plugs and the gate electrodes by using a line-type supporter.

According to the embodiment of the present invention, since a sacrificial pad serves as an etch stop layer during the etching of an alternating stack, a lower structure may be prevented from being punched.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a source structure over a lower structure with interconnections;

forming a first contact plug that penetrates the source structure to be coupled to the interconnections, and a sacrificial pad that penetrates the source structure and is spaced apart from the first contact plug;

forming an upper structure that covers the sacrificial pad, the first contact plug, and the source structure, the upper structure including a first region and a second region, and each of the first and second regions including first alternating stack of dielectric layers and sacrificial layers;

forming a second contact plug that penetrates the first region of the upper structure and contacts the first contact plug;

forming a dummy sacrificial pad that penetrates the first region of the upper structure to contact the sacrificial pad and is spaced apart from the second contact plug, the dummy sacrificial pad is formed on the sacrificial pad;

removing the sacrificial pad and the dummy sacrificial pad to form a support opening;

forming a dielectric supporter in the support opening; and replacing the sacrificial layers of the second region of the upper structure with conductive layers, wherein the second region of the first alternating stack is replaced with a second alternating stack of the conductive layers and the dielectric layers, wherein the second alternating stack includes a stepped structure extending to directly contact the dielectric supporter, the stepped structure of the second alternating stack being supported by the dielectric supporter, and wherein the dielectric supporter directly contacts the first alternating stack of dielectric layers and sacrificial layers.

2. The method of claim 1, wherein the sacrificial pad has a width that is greater than a width of the dummy sacrificial pad.

3. The method of claim 1, wherein the sacrificial pad and the dummy sacrificial pad include a material with an etch selectivity with respect to the upper structure.

4. The method of claim 1, wherein the dielectric layers of the first alternating stack includes silicon oxides and the sacrificial layers of the first alternating stack includes silicon nitrides, and wherein the sacrificial pad includes a material with an etch selectivity with respect to the silicon oxides and the silicon nitrides.

5. The method of claim 1, wherein the first contact plug and the sacrificial pad include tungsten.

6. The method of claim 1, further comprising:

forming a contact hole that penetrates the source structure to expose an upper surface of the interconnections; and forming a sacrificial opening that penetrates the source structure to expose the lower structure, wherein the first contact plug fills the contact hole, and the sacrificial pad fills the sacrificial opening.

7. The method of claim 1, further comprising:

forming a contact hole that exposes an upper surface of the interconnections; and etching the source structure to form a line-type opening and a hole-type opening that are spaced apart from each other, wherein the first contact plug fills the contact hole, and wherein the sacrificial pad includes a line-type sacrificial pad that fills the line-type opening and a pillar-type sacrificial pad that fills the hole-type opening.

8. A method for fabricating a semiconductor device, comprising:

forming a source structure over a lower structure including interconnections;

forming a first contact plug that penetrates the source structure to be coupled to the interconnections;

forming a first line-type sacrificial pad that penetrates the source structure and is spaced apart from the first contact plug;

forming a first alternating stack of dielectric layers and sacrificial layers over the first line-type sacrificial pad, the first contact plug, and the source structure, wherein the first alternating stack including a first region and a second region;

forming a second contact plug that penetrates the first region of the alternating stack and contacts the first contact plug;

forming a second line-type sacrificial pad that is spaced apart from the second contact plug to penetrate the first region of the alternating stack and contact the first line-type sacrificial pad;

removing the first and second line-type sacrificial pads to form a line-type support opening;

forming a line-type supporter in the line-shape support opening;

forming a plurality of channel structures that penetrate the second region of the alternating stack and the sacrificial source layer, the plurality of channel structures formed to be spaced apart from the line-type supporter; and replacing the sacrificial layers of the second region of the first alternating stack with gate electrodes, wherein the second region of the first alternating stack is replaced with a second alternating stack of the gate electrodes and the dielectric layers, wherein the second alternating stack includes a stepped structure extending to directly contact the line-type supporter, the stepped structure of the second alternating stack being supported by the line-type supporter, and wherein the line-type supporter directly contacts the first alternating stack of dielectric layers and sacrificial layers.

9. The method of claim 8, wherein the first region of the first alternating stack includes a contact region, and the second region of the first alternating stack includes a cell array region, wherein a channel structure of the plurality of channel structures penetrates the cell array region, and the line-type supporter penetrates the contact region, and wherein the contact region further includes a stepped structure that extends from the cell array region of the first alternating stack.

10. The method of claim 9, further comprising:

forming a plurality of pillar-type supporters that penetrate the stepped structure.

11. The method of claim 8, wherein the line-type supporter includes a dielectric material.

12. The method of claim 8, wherein the first line-type and second line-type sacrificial pads include a material with an etch selectivity with respect to the dielectric layers and the sacrificial layers.

13. The method of claim 8, wherein the first line-type and second line-type sacrificial pads include tungsten.

14. The method of claim 8, further comprising:
after the forming of the channel structures:
forming a slit that exposes the sacrificial source layer by etching the first alternating stack;
selectively removing the sacrificial source layer through the slit to form a source-level recess that extends laterally in the source structure; and
replacing the sacrificial source layer with a source level contact layer.

15. A method for fabricating a semiconductor device, comprising:
forming a source structure over a lower structure with interconnections;
forming a first alternating stack of a plurality of dielectric layers and a plurality of sacrificial layers over the source structure, wherein the first alternating stack including a first region and a second region;
forming a line-shape dummy sacrificial pad in the first region of the first alternating stack;
removing the line-shape dummy sacrificial pad to form a line-type support opening;
forming a line-type supporter in the line-type support opening;
forming a vertical slit in the second region of the first alternating stack;
selectively removing the plurality of sacrificial layers of the first region of the first alternating stack through the vertical slit to form lateral recesses between the dielectric layers; and
forming gate electrodes in the lateral recesses, wherein the second region of the first alternating stack is replaced with a second alternating stack of the gate electrodes and the dielectric layers,
wherein, while the sacrificial layers of the second region of the first alternating stack are being replaced with the gate electrodes, the sacrificial layers of the first region of the first alternating stack are not replaced, and
wherein the second alternating stack includes a stepped structure extending to directly contact the line-type supporter, the stepped structure of the second alternating stack being supported by the line-type supporter, and
wherein the line-type supporter directly contacts the first alternating stack of dielectric layers and sacrificial layers.

16. The method of claim 15, further comprising:
forming a plurality of pillar-type supporters that penetrate the first alternating stack simultaneously as the line-type supporter are formed,
wherein the pillar-type supporters are surrounded by the gate electrodes.

17. The method of claim 15, further comprising:
forming a line-type etch stop metal pad that penetrates the source structure before the forming of the first alternating stack.

18. The method of claim 17, wherein the forming of the line-type supporter includes:
forming a line-type metal pad that penetrates the first alternating stack and contacts the line-type etch stop metal pad; and
replacing the line-type metal pad and the line-type etch stop metal pad with a dielectric material to form the line-type supporter.

19. The method of claim 15, further comprising:
forming a contact plug that penetrates the second alternating stack to be coupled to the interconnections,
wherein the contact plug is spaced apart from the line-type supporter, and the gate electrodes directly contact the line-type supporter.

20. The method of claim 17, wherein the forming of the contact plug includes:
forming a first contact plug that penetrates the source structure to directly contact the interconnections; and
forming a second contact plug that penetrates the first alternating stack and contacts the upper surface of the first contact plug.

* * * * *